(12) United States Patent
Arimoto et al.

(10) Patent No.: US 6,404,684 B2
(45) Date of Patent: Jun. 11, 2002

(54) TEST INTERFACE CIRCUIT AND SEMICONDUCTOR INTEGRATED CIRCUIT DEVICE INCLUDING THE SAME

(75) Inventors: Kazutami Arimoto; Hiroki Shimano, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/741,147

(22) Filed: Dec. 21, 2000

(30) Foreign Application Priority Data

Dec. 24, 1999 (JP) .......................................... 11-366504

(51) Int. Cl.[7] ................................................ G11C 7/00
(52) U.S. Cl. .................... 365/201; 365/230.08; 365/233
(58) Field of Search .......................... 365/201, 230.06, 365/233, 235, 230.03, 230.08, 231, 238.5

(56) References Cited

U.S. PATENT DOCUMENTS 5,996,052 A * 11/1999 Taniguchi et al. .......... 711/155

6,195,771 B1 * 2/2001 Tanabe et al. ............... 714/718
6,253,333 B1 * 6/2001 Bogumil et al. ............. 713/503

FOREIGN PATENT DOCUMENTS

| JP | 9-91955 | 4/1997 |
| JP | 411306798 A | * 11/1999 |

* cited by examiner

*Primary Examiner*—Amir Zarabian
*Assistant Examiner*—Hien Nguyen
(74) *Attorney, Agent, or Firm*—McDermott, Will & Emery

(57) ABSTRACT

In a test interface circuit arranged between an embedded memory and a test data input/output (I/O) terminal, a first-in first-out circuit for successively storing test data is arranged for controlling a latency of data read from the embedded memory. The test interface circuit for the embedded memory can reduce the number of test data I/O terminals, and can increase the executable test patterns.

19 Claims, 12 Drawing Sheets

TEST INTERFACE CIRCUIT AND SEMICONDUCTOR INTEGRATED CIRCUIT DEVICE INCLUDING THE SAME

BACKGROUND OF THE INVENTION

1. Field of the Invention

The present invention relates to a test interface circuit and a semiconductor integrated circuit device using the same, and particularly relates to a test interface circuit for externally and directly testing a logic-merged memory as well as a semiconductor integrated circuit device including the same.

2. Description of the Background Art

In a system LSI such as a logic-merged DRAM, in which a logic such as a processor or an ASIC (Application Specific Integrated Circuit) and a Dynamic Random Access Memory (DRAM) of a large storage capacity or the like are integrated on a common semiconductor chip (semiconductor substrate), the logic and the DRAM are interconnected via an internal data bus of multiple bits from 128 bits to 512 bits for achieving a data transfer rate faster by one, two or more orders than that of a general-purpose DRAM. The DRAM and the logic are interconnected via internal interconnection lines, which are much shorter in length and smaller in parasitic impedance than on-board interconnection lines. Therefore, charge/discharge currents of the data bus can be significantly reduced, and signal transfer can be performed at high speed. Since the logic is connected to the DRAM via internal interconnection lines, external pin terminals of the logic can be smaller in number than those of the type that a general-purpose DRAM is externally attached to the logic. Because of the foregoing reasons, the DRAM-embedded system LSI significantly contributes to improvement of a performance of an information device handling a large amount of data, e.g., for three-dimensional graphics, image or audio processing.

In the logic-merged DRAM, only the logic is coupled to pin terminals via pads. Therefore, a function test of the embedded DRAM must be performed via the logic. However, the logic performs control for carrying out the test, and therefore has to bear a large load. Further, such operations are required that an instruction for performing a function test of the DRAM is externally applied to the logic, a control signal for performing the function test is applied from the logic to the DRAM, and a result of the test must be read out via the logic. Thus, the function test of DRAM is executed via the logic so that tests of, e.g., an operation timing margin of the DRAM cannot be performed accurately. Further, from a viewpoint of a program capacity, the logic can generate only a limited number of test patterns so that the test cannot be performed sufficiently, and it is difficult to sufficiently ensure the reliability of the DRAM. As a gate scale of the logic increases, the probability of occurrence of a failure in the logic itself increases so that the reliability of the memory test lowers.

Accordingly, it becomes necessary to carry out externally and directly the test on the DRAM via a dedicated test device.

FIG. 13 schematically shows a structure of a DRAM-embedded system LSI in the prior art. In FIG. 13, the system LSI includes a large scale logic LG which is coupled to an external pin terminal group LPGA and executes instructed processing, an analog core ACR which is coupled between large scale logic LG and an external pin terminal group APG and processes analog signals, a DRAM core MCR which is coupled to large scale logic LG via internal interconnection lines, and stores data required by large scale logic LG, and a test interface circuit TIC which isolates large scale logic LG from DRAM core MCR, and couples an external memory tester to DRAM core MCR via a pin terminal group TPG in a test mode. DRAM core MCR receives a power supply voltage VCC via a power supply pin terminal PST.

Analog core ACR includes a phase locked loop circuit (PLL) generating an internal clock signal, an analog-to-digital converter for converting an externally applied analog signal to a digital signal, a digital-to-analog converter for converting a digital signal sent from large scale logic LG to an analog signal for outputting it.

DRAM core MCR is a clock-synchronous memory (SDRAM).

Large scale logic LG includes a memory control unit for executing processing, e.g., of image/audio information and controlling access to DRAM core MCR.

By providing test interface circuit TIC as shown in FIG. 13, DRAM core MCR can be completely isolated from the logic, and can be directly accessed via external pin terminal group TPG, and therefore DRAM core MCR can be directly and externally controlled, and can be externally monitored. The test performed in this manner is called a direct memory access test. By providing test interface circuit TIC, a conventional memory tester can be utilized, and the test substantially the same in contents as that of a general-purpose DRAM (SDRAM) can be carried out.

FIG. 14 shows a structure of a test interface circuit TIC shown in FIG. 13 and a portion related to it. In FIG. 14, pin terminal group TPG includes a pin terminal receiving a test clock signal TCLK, a pin terminal receiving a test address TAD designating a memory cell in DRAM core MCR to be accessed in the test mode, a pin terminal receiving test input data TDin in the test mode, and a pin terminal receiving test data TDout from test interface circuit TIC in the test mode. Test input data TDin applied to test interface circuit TIC and test data TDout sent from test interface circuit TIC have a bit width of, e.g., 8 bits similar to data in the general-purpose DRAM.

Test interface circuit TIC includes: a latch and command decoder 1 which takes in a test control signal TCMD, test address TAD and test input data TDin applied to pin terminal group TPG, decodes test control signal TCMD into an internal command to be issued to DRAM core MCR, and performs operations such as expansion of test input data TDin of an 8-bit width to write data of 256 bits; a mode register 2 which stores information such as a column latency of DRAM core MCR; a CA shifter 3 which shifts a read data select signal RD_S applied from latch and command decoder 1 in accordance with column latency information stored in mode register 2 and others; a 256-to-8 select circuit 4 which selects data of 8 bits from test read data TIFDout of 256 bits read from DRAM core MCR in accordance with read data select signal RD_S read from CA shifter 3.

As test peripheral circuits, there are arranged: a selector 5 which is responsive to a test mode instructing signal TE to couple DRAM core MCR selectively to the large scale logic and test interface circuit TIC; a gate circuit 6 which receives clock signal CLK applied from the large scale logic in the normal operation mode and test clock signal TCLK applied in the test mode, and applies a clock signal to DRAM core MCR; and a gate circuit 7 which transmits read data RD of 256 bits read from DRAM core MCR to test interface circuit TIC when test mode instructing signal TE is active. Read data RD of 256 bits read from DRAM core MCR is applied to the large scale logic without passing through selector 5.

This is for the purpose of applying the read data fast to the large scale logic in the normal operation mode.

DRAM core MCR is a clock-synchronous DRAM (SDRAM), and operates in synchronization with the clock signal to take in data/signal applied from selector 5 and output read data RD.

Operations of the test interface circuit shown in FIG. 14 will now be described with reference to a timing chart of FIG. 15.

As shown in FIG. 14, DRAM core MCR transfers write data INDin and read data RD through separated paths, respectively. Likewise, test input data TDin and test data TDout are transferred through different test pin terminals in the test operation, respectively.

Test control signals TCMD including signals /RAS, /CAS, /WE and others are decoded to attain a state for reading out data from DRAM core MCR, or applying a read command READ to DRAM core MCR. Test control signal TCMD applied in a clock cycle #1 is decoded by latch and command decoder 1, and the result of decoding is applied as read command READ from test interface circuit TIC to DRAM core MCR via selector 5 in a clock cycle #2 with a delay of one clock cycle. In the test mode, selector 5 isolates the large scale logic from DRAM core MCR in accordance with test mode instructing signal TE, and selects a test interface command TIFCMD, a test interface address TIFAD and a test interface input data TIFDin generated from test interface circuit TIC for transference to DRAM core MCR. Gate circuit 7 transmits data RD read from DRAM core MCR to test interface circuit TIC in accordance with the test mode instructing signal.

DRAM core MCR takes in signal/data in accordance with the clock signal, which in turn is produced in accordance with test clock signal TCLK in the test mode, and is applied from gate circuit 6. Internal command INCMD which is currently applied is read command READ, so that the reading of internal data is executed in accordance with a currently applied internal address INADD. If column latency CL of DRAM core MCR is two clock cycles, valid read data is output at the rising edge of clock signal TCLK in a cycle #4 in accordance with internal read command READ (INCMD) already applied in cycle #2.

In test interface circuit TIC, CA shifter 3 performs shifting by the cycle period of column latency CL in accordance with a select signal included in test address TAD. The shifting period additionally includes a delay time in test interface circuit TIC if the select signal is produced from test address TAD. Accordingly, when read data RD of 256 bits read from DRAM core MCR reaches select circuit 4 through gate circuit 7, select signal RD_S generated from CA shifter 3 attains the definite state. The select circuit 4 selects data of 8 bits from the data of 256 bits in accordance with select signal RD_S, and transmits it as test data TDout (DO0) to the test pin terminal.

It is now assumed that write command WRITE instructing data writing is externally applied to DRAM core MCR in clock cycle #2. When the write command is applied, test input data TDin (DA) is applied to the test pin terminal at the same time. Write command WRITE and test input data DA are transferred by test interface circuit TIC in accordance with test clock signal TCLK, and are applied to DRAM core MCR with a delay of one clock cycle. Latch and command decoder 1 includes a bit width expanding circuit for input data TDin, and test input data DA (TDin) of 8 bits is converted to internal write data DAin of 256 bits (data lines of 8 bits are expanded to data lines of 256 bits).

As test control signal TCMD, a test control signal which is decoded into read command READ instructing data reading is applied in a clock cycle #3, and a test control signal decoded into write command WRITE instructing data writing is applied in a subsequent clock cycle #4. In this case, internal write data DBin is applied to DRAM core MCR in a clock cycle #5, and data Dout of 256 bits is read from DRAM core MCR in a subsequent clock cycle #6. Then, select circuit 4 of test interface circuit TIC outputs read data DO1 of 8 bits as test data TDout in clock cycle #6.

Mode register 2 stores data indicative of the signal transmission delay (one clock cycle in the example shown in FIG. 15) in test interface circuit TIC and the number of cycles of column latency CL. CA shifter 3 performs the shift operation for a period set in mode register 2 so that the data read from DRAM core MCR can be selected and read as the test data at an accurate timing.

Owing to provision of test interface circuit TIC described above, an external tester can directly access DRAM core MCR, and necessary tests of DRAM core MCR can be performed with a tester for a general-purpose SDRAM.

The test interface circuit converts the read data of 256 bits of data bus width of DRAM core MCR to the output data of 8 bits. When the data of 256 bits is directly applied to the external memory tester, data processing on the memory tester side becomes extremely difficult, and in addition the number of test data I/O pins increases to 512 (=256×2), which is not an available value in view of practical use. In this test interface circuit, therefore, test input data TDin of 8 bits is expanded to input data of 256 bits. Also, in the select circuit, read data TIFDout of 256 bits is converted to data TDout of 8 bits.

As described above, the pins required for the test are reduced in number. However, the large scale logic LG in the DRAM-embedded system LSI performs input/output of many signals for system interface with an external device, and therefore large scale logic LG requires a large number of external pin terminals. For testing analog core APG including analog circuits such as an analog-digital converter and a PLL, external pin terminals must be allocated to analog core ACR. Therefore, it may possibly be impossible to allocate a sufficient number of external pin terminals to test interface circuit TIC for externally and directly testing the DRAM core.

In test interface circuit TIC, test address pin terminals for an external address, which requires many external pin terminals, can be reduced through the approach that time-division multiplex of row and column addresses is performed so as to share external address pin terminals between row and column addresses. Further, relating to data pin terminals requiring 16 pins in total, a bidirectional input/output (I/O) circuit is arranged for commonly using pin terminals as test data input pins and test data output pins, to save, the pin terminals for the test data. As a secondary effect, it is also possible to reduce the number of interconnection lines between test data I/O pin terminals and test interface circuit TIC. However, if the bidirectional I/O circuit is used for transferring the test data to and from DRAM core MCR via test interface circuit TIC, conflict occurs between the test input data and the test output data, and therefore DRAM core MCR cannot be tested at a practical operation speed. This disadvantage will now be described in greater detail.

FIG. 16 schematically shows a structure of a bidirectional I/O circuit. In FIG. 16, a bidirectional I/O circuit 8 is arranged between test interface circuit TIC and a test data terminal group 9 of 8 bits. Bidirectional I/O circuit 8 includes: a tristate buffer circuit 8a which is activated, when an output enable signal OE is activated, to buffer 8-bit data transmitted from test interface circuit TIC for transference to test data terminal group 9; and an input buffer circuit 8b which is inactive, when output enable signal OE is activated, to buffer 8-bit test data TD applied to test data terminal group 9 for application to latch and command decoder 1. A direct memory access test utilizing this bidirectional I/O circuit 8 will now be described with reference to a timing chart of FIG. 17.

In cycle #0 of test clock signal TCLK, test control signal TCMD, which is decoded into read command READ, is applied in synchronization with falling of test clock signal TCLK. In the next cycle, test control signal TCMD which is decoded into write command WRITE is applied. A period of one clock cycle is required for switching of activation between the input and output circuits in bidirectional I/O circuit 8. Therefore, an external tester lowers (deactivates) to L-level in clock cycle #0.

In test interface circuit TIC, one clock cycle period is required for transferring signal/data. Therefore, internal command INCMD becomes read command READ at the falling of test clock signal TCLK in clock cycle #1, and then internal command INCMD becomes write command WRITE in next clock cycle #2. At the falling of test clock signal TCLK in clock cycle #1, test input data Din is applied as test data TD simultaneously with write command WRITE.

According to test control signal TCMD which is externally applied and is decoded into read command READ in synchronization with the falling of test clock signal TCLK in clock cycle #0, test interface circuit TIC produces test output data TD as test data Dout after elapsing of column latency CL and the delay time of signal transfer in test interface circuit TIC, i.e., elapsing of three clock cycles. Accordingly, after externally applying test control signal TCMD decoded into write command WRITE in clock cycle #1, output enable signal OE is set to H-level in synchronization with falling of test clock signal TCLK in clock cycle #2 for externally taking out the test output data. When test output data Dout is to be output, therefore, output buffer circuit 8a stably operates, and bidirectional I/O circuit 8 reliably buffers and outputs test output data Dout.

It is prohibited to apply externally the test control signal, which is decoded into write command WRITE, in synchronization with falling of test clock signal TCLK in clock cycle #3. This is because the data is read to the test data I/O terminal group in accordance with test control signal TCMD which is externally applied in clock cycle #0 and is decoded into read command READ.

In next clock cycle #4, test control signal TCMD which is decoded into write command WRITE, is not externally applied. Output enable signal OE is set to H-level for reading out data Dout in a period from clock cycle #3 to clock cycle #4. Even if output enable signal OE is set to L-level in response to falling of test clock signal TCLK in clock cycle #4, switching of the input/output I/O circuits is not performed adequately in clock cycle #4, and it is impossible for test interface circuit TIC to take in test data for application in a stable manner.

In clock cycle #5, test data Dout is output in accordance with the control signal, which in turn is decoded into read command READ and is externally applied in synchronization with falling of test clock signal TCLK in clock cycle #2. In clock cycle #5, therefore, it is likewise impossible to apply write command WRITE.

In this case, it is necessary to set output enable signal OE to H-level. In the case where output enable signal OE is set to L-level in synchronization with falling of test clock signal TCLK in next clock cycle #6, switching between input and output in bidirectional I/O circuit 8 is not performed adequately, and therefore write command WRITE cannot be applied in this clock cycle #6. Accordingly, it is necessary to apply a no-operation command NOP in a period from clock cycle #3 to clock cycle #6.

In synchronization with falling of test clock signal TCLK in clock cycle #7, the test control signal decoded into write command WRITE is applied. Output enable signal OE was already lowered to L-level one clock cycle before, and therefore input buffer circuit 8b in bidirectional I/O circuit 8 can stably operate to take in test input data Din.

In the case where the test control signal decoded into write command WRITE is applied, it is necessary to apply test input data Din to test interface circuit TIC at the same time. Therefore, in view of one clock cycle period required for switching between input and output in bidirectional I/O circuit 8 and signal transfer delay in bidirectional I/O circuit 8, it is necessary to set output enable signal OE to L-level for setting bidirectional I/O circuit 8 to the input mode in a cycle preceding the application of the write command by one clock cycle or more. Accordingly, in the timing chart shown in FIG. 17, output enable signal OE is set to L-level in a cycle preceding the application of write command WRITE by one clock cycle. However, depending on the frequency of test clock signal TCLK, it may be necessary to set output enable signal OE to the data input instructing state two or three clock cycles before.

In the case where only the read command or only the write command is successively applied to the DRAM core, a problem related to the signal definite timing of output enable signal OE does not occur. Output enable signal OE is fixed to H- or L-level, and the read or write command is successively applied. However, in the case where read and write commands READ and WRITE are alternately applied as shown in FIG. 17, commands NOP (no-operation) equal in number to the clock cycles requiring output enable signal OE fixed to L-level, must be applied before application of write command WRITE. Further, such a constraint is also added that conflict between the test input data and the test output data must be avoided. In the case shown in FIG. 17, commands NOP are inserted for four clock cycles. As test clock signal TCLK becomes further fast, commands NOP to be inserted further increase in number.

Accordingly, in the case where the test data output terminals and the test data input terminals commonized for reducing the number of the test pin terminals, it is impossible to perform tests of successive operations (e.g., read-write-read-write) in accordance with the page mode, and it is substantially impossible to perform the test on the DRAM core at the practical speed.

SUMMARY OF THE INVENTION

An object of the invention is to provide a test interface circuit which allows a test of a logic-merged memory without increasing the number of test pin terminals and without limitation on test patterns.

Another object of the invention is to provide a semiconductor integrated circuit device including a logic-merged DRAM, in which the DRAM can be externally and adequately tested without a limitation on externally applied test patterns.

Still another object of the invention is to provide a test interface circuit, in which a test data output terminal and a test data input terminal can be made common structure while allowing a logic-merged DRAM to be externally tested without limitations on test patterns, as well as a semiconductor integrated circuit device provided with the test interface circuit.

According to a first aspect, a test interface circuit includes a first-in first-out circuit for successively storing data read from an embedded memory, and successively reading out the stored data in the same order as the storing order, and a control circuit for controlling data writing and reading of the first-in first-out circuit in response to an operation mode instructing signal instructing data input/output.

According to a second aspect, a semiconductor integrated circuit includes a logic, a memory storing data for the logic, and a test interface circuit for allowing external direct access to the memory in a test operation mode. The test interface circuit includes a first-in first-out circuit for successively storing data read from the memory, and successively reading out the stored data in the same order as the storing order, and a control circuit for controlling data writing/reading of the first-in first-out circuit in response to an operation mode instructing signal instructing data input/output.

The first-in first-out circuit stores the data read from the embedded memory in accordance with a read command, and a data output latency of the test interface circuit can be changed by controlling read timing. Accordingly, a test of successive wrote/read operations can be performed without a conflict between data even if common test data input/output pin are employed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
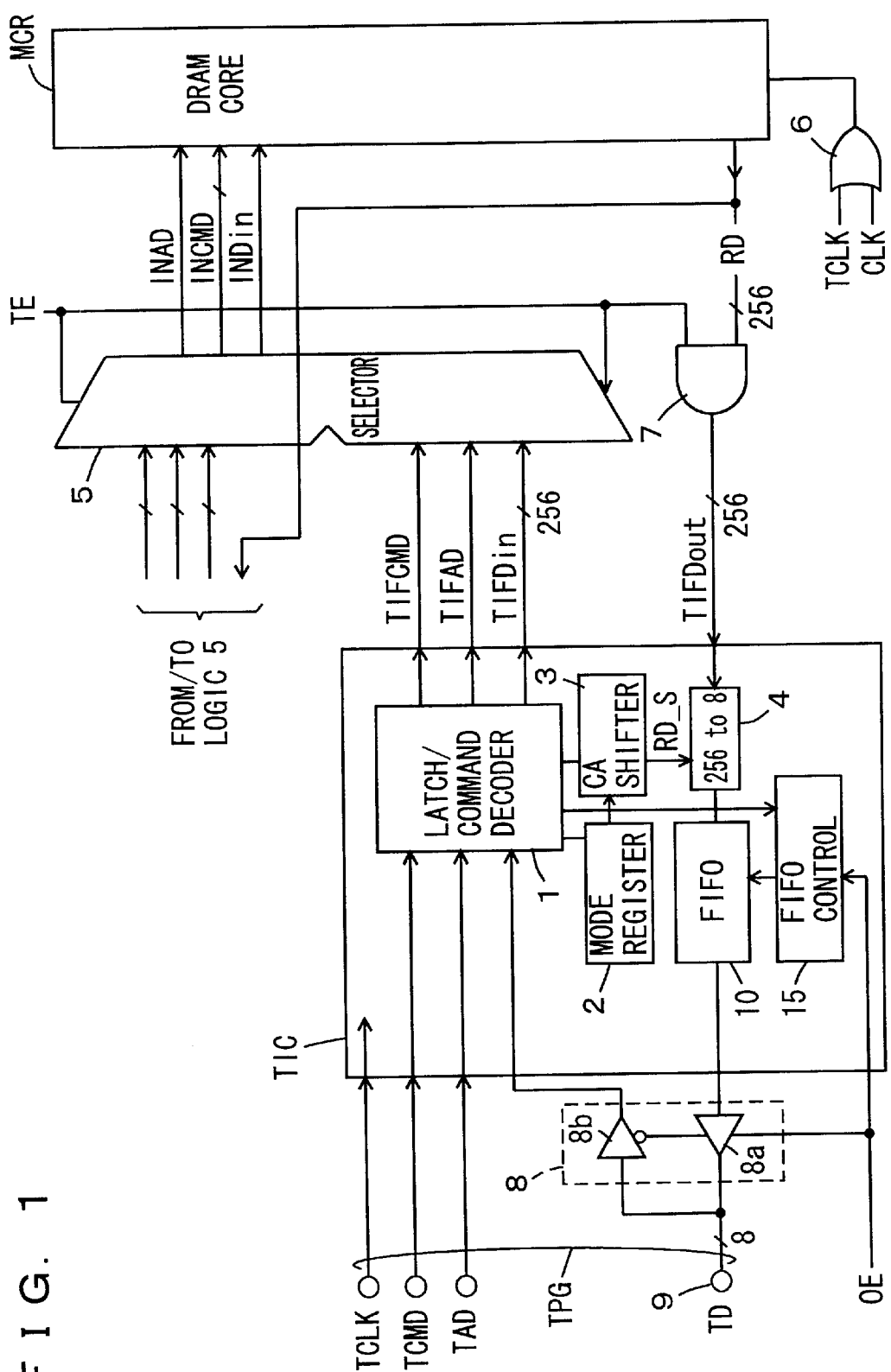
FIG. 1 schematically shows a structure of a test interface circuit according to a first embodiment of the invention.

FIG. 1 schematically shows a structure of a test interface circuit according to a first embodiment of the invention. In the structure shown in FIG. 1, test interface circuit TIC is coupled to a test data input/output (I/O) terminal 9 via a bidirectional I/O circuit 8. Bidirectional I/O circuit 8 includes an output buffer circuit 8a and an input buffer circuit 8b, and has the data transfer direction determined by an output enable signal OE.

Figure 14:
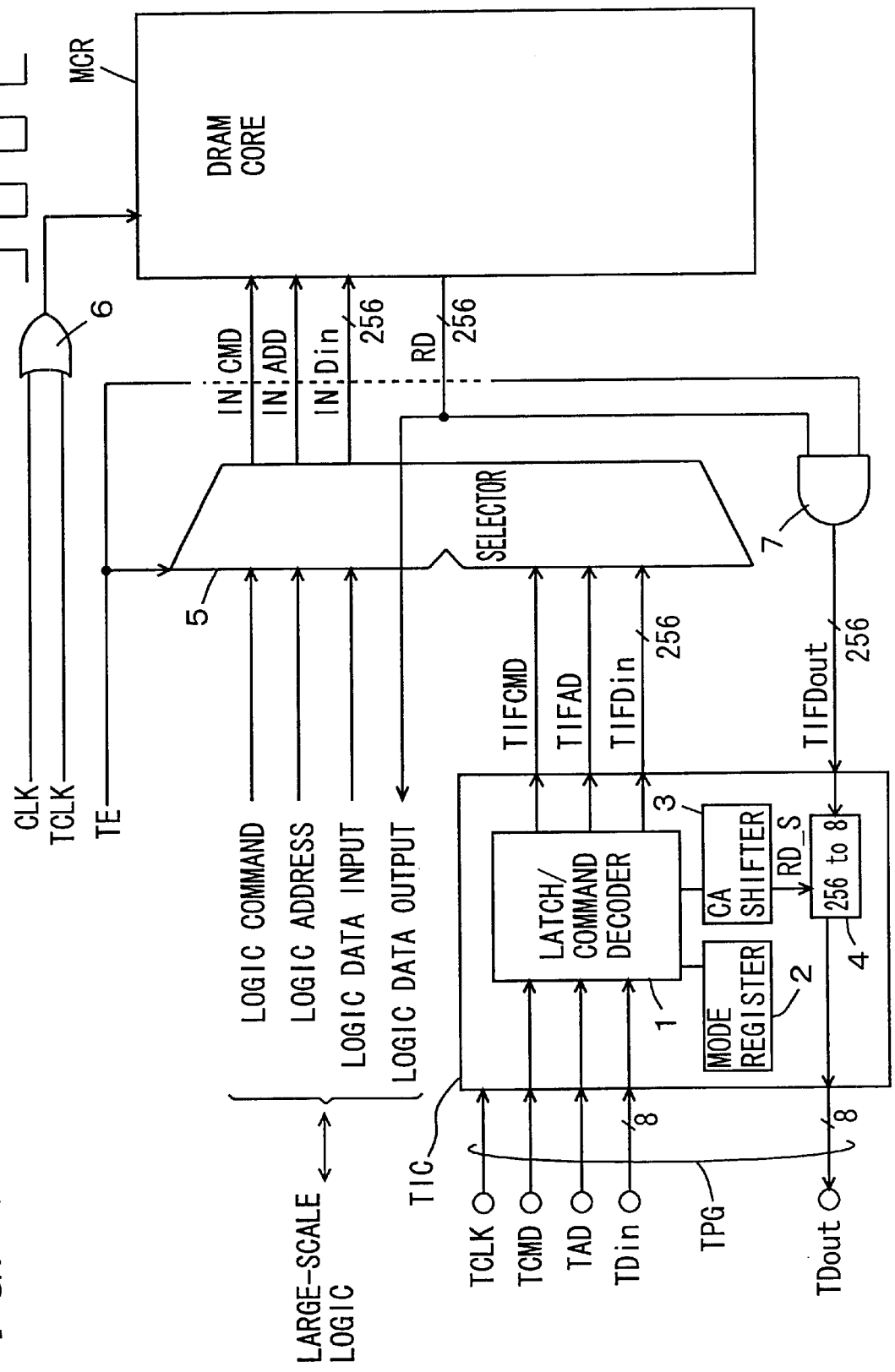
FIG. 14 schematically shows a structure of a test interface circuit of the system LSI shown in FIG. 13.
Figure 15:
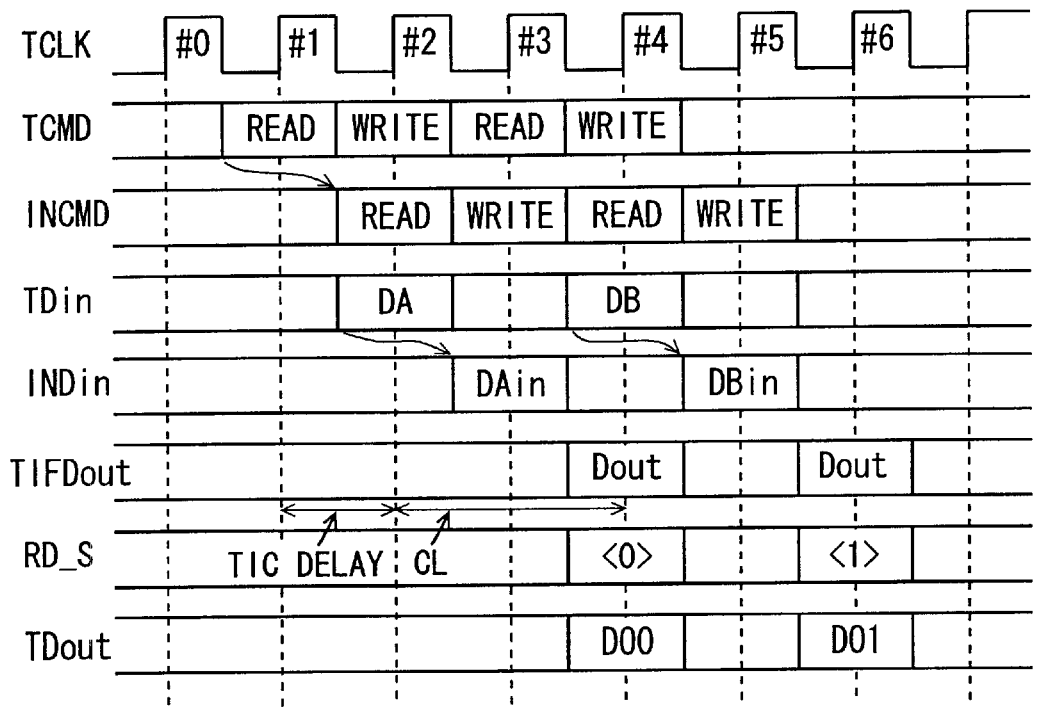
FIG. 15 is a timing chart representing operations of the test interface circuit shown in FIG. 14.
Figure 16:
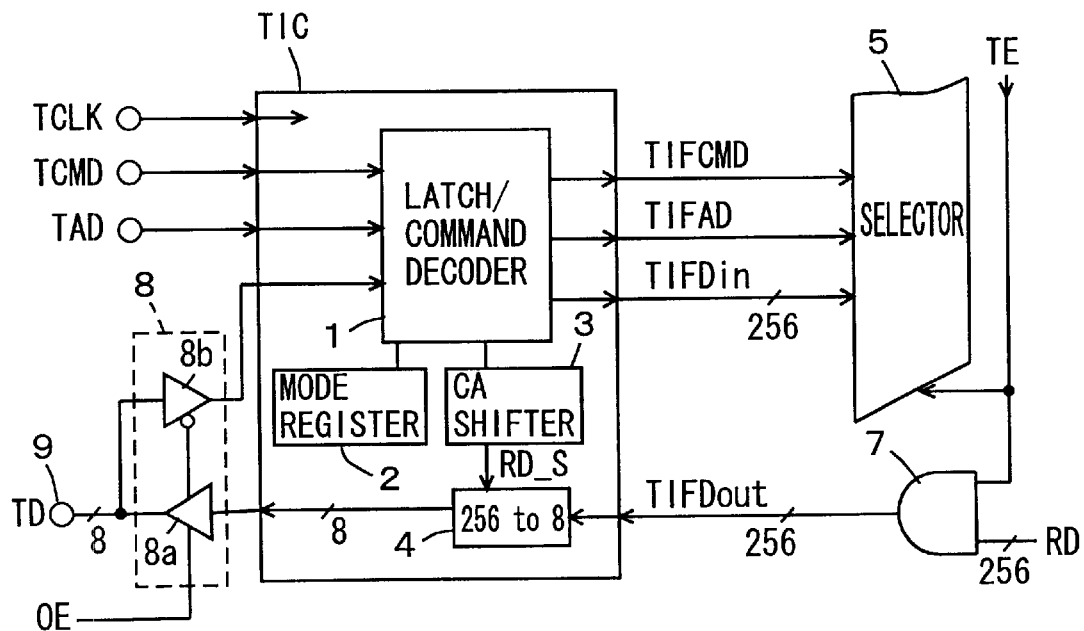
FIG. 16 shows a structure in which the test interface circuit shown in FIG. 14 is applied to a structure of common test data I/O terminals.
Figure 17:
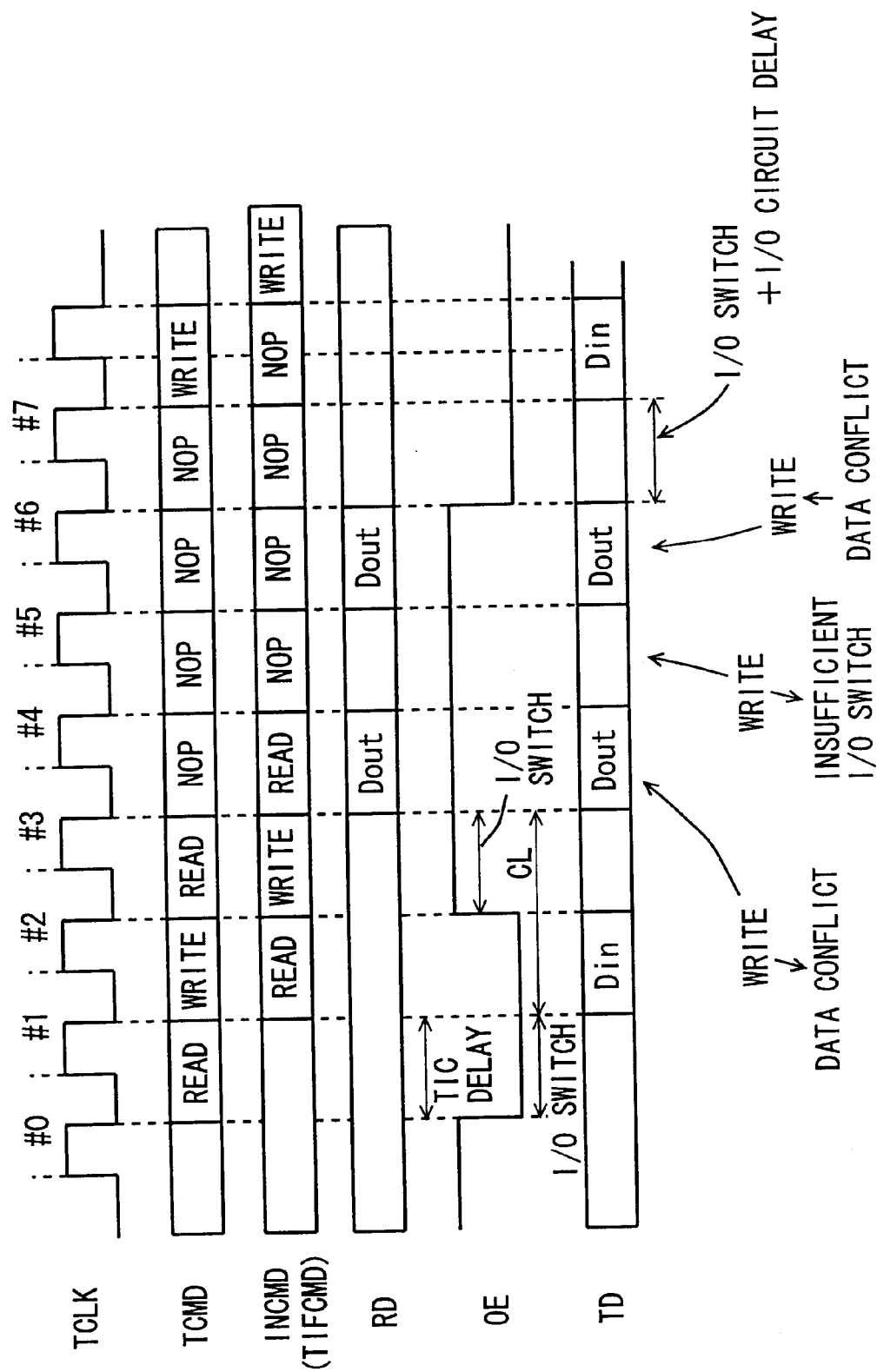
FIG. 17 is a timing chart representing operations of the circuit shown in FIG. 16.

Test interface circuit TIC includes: a latch and command decoder 1 which takes in a test control signal TCMD and a test address TAD applied via a test pin group TPG in accordance with a test clock signal TCLK, decodes test control signal TCMD, takes in test input data applied from bidirectional I/O circuit 8, and expands the bit width of the test input data; a mode register 2 which stores column latency information of a DRAM core MCR and others; a CA shifter 3 which operates, in accordance with the column latency information stored in mode register 2, to shift the read select signal applied from latch and command decoder 1 by a period of the column latency and the signal transfer delay in test interface circuit TIC; and a 256-to-8 select circuit 4 which selects data of 8 bits, in accordance with a read select signal RD_S via CA shifter 3, from read data TIFDout of 256 bits sent from DRAM core MCR through a gate circuit 7. These components have the same structures as those in the test interface circuit TIC shown in FIG. 14.

Test interface circuit TIC further includes: a First-In First-Out (FIFO) circuit 10 which successively stores data of 8 bits received from 256-to-8 select circuit 4, and outputs the stored data in the same order as the storing order; and an FIFO control circuit 15 which controls write/read operations of first-in first-out circuit 10 in accordance with output enable signal OE and a read instructing signal (read command) applied from latch and command decoder 1.

When output enable signal OE instructs the data input mode (i.e., is at L-level), FIFO control circuit 15 counts the read instructing signal sent from latch and command decoder 1, to count the number of test read data to be stored in first-in first-out circuit 10, and controls the operation of writing data into first-in first-out circuit 10. Further, FIFO control circuit 15 successively reads out the stored data in accordance with test clock signal TCLK for application to output buffer circuit 8a included in bidirectional I/O circuit 8, when output enable signal OE changes from an input mode instructing state (L-level) to an output mode instructing state (H-level).

In the data input mode of bidirectional I/O circuit 8, therefore, first-in first-out circuit 10 performs the data storing operation at most, and does not perform the data read operation. When the data input mode is completed and the test input data is no longer present on test data I/O terminal 9, data is read from first-in first-out circuit 10, and the test data is applied via output buffer circuit 8a to test data I/O terminal 9. Therefore, even in the case where the write command and the read command are applied alternately, conflict between the data does not occur because the test data are successively read out from first-in first-out circuit 10 after application of the test control signal decoded into the write command is completed.

By flexibly changing the latency of the test data output by first-in first-out circuit 10, conflict between the test input data and test output data does not occur on the test data I/O terminal even if the read and write commands are successively applied. Therefore, even the common I/O pin terminal can be used for performing successively read/write test in the direct memory access test of the DRAM core. Referring to a timing chart of FIG. 2, description will now be given on operations of the test interface circuit of the first embodiment of the invention.

When successive read/write operation test is to be performed, test control signal TCMD decoded into active command ACT is applied, and memory cells of one page are selected in DRAM core MCR. The one page represents the memory cells which are driven to the selected state by the row select operation performed in DRAM core MCR when active command ACT is applied to instruct the row access to DRAM core MCR.

Figure 2:
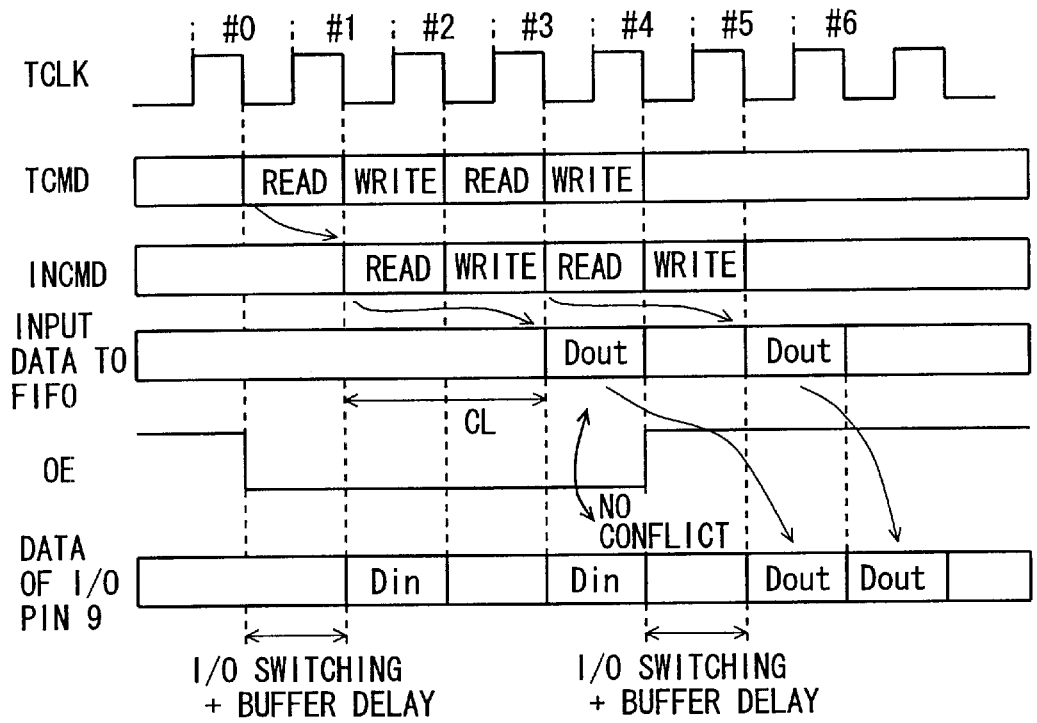
FIG. 2 is a timing chart representing operations of the test interface circuit shown in FIG. 1.

After the test control signal corresponding to active command ACT is applied, output enable signal OE is set to L-level, and bidirectional I/O circuit 8 is set to the data input mode. In FIG. 2, test control signal TCMD decoded into read command READ is externally applied at the falling of test clock signal TCLK in cycle #0 of test clock signal TCLK, and output enable signal OE falls from H-level to L-level in parallel with application of the control signal decoded into read command READ.

Bidirectional I/O circuit 8 requires one clock cycle period for switching between its input and output modes, and also a delay in time occurs when the write data is applied to latch and command decoder 1 via bidirectional I/O circuit 8. Consideration must be given to those period and delay time in applying write command WRITE and test input data Din. In FIG. 2, it is assumed that the signal transfer delay in bidirectional I/O circuit 8 can be neglected.

Output enable signal OE falls to L-level in response to the falling of test clock signal TCLK in cycle #0. Therefore, even if test input data Din is applied simultaneously with the test control signal decoded into write command WRITE at the falling of test clock signal TCLK in next cycle #1, input buffer circuit 8b in bidirectional I/O circuit 8 is already set to the operable state, and it can reliably buffer test input data Din of 8 bits applied to test data I/O terminal group 9, for transmission to latch and command decoder 1.

Then, the control signals forming read command READ and write command WRITE are externally applied in synchronization with falling of test clock signal TCLK in cycles #2 and #3, respectively. These test control signals TCMD are sent as internal command INCMD via test interface circuit TIC and selector 5, and are applied to DRAM core MCR with a delay of one clock cycle. DRAM core MCR executes write/read of the data in accordance with received internal command INCMD.

When read command READ is applied, DRAM core MCR outputs valid data Dout after elapsing of column latency CL. FIG. 2 shows by way of example the operations performed with column latency CL equal to 2. In DRAM core MCR, a bus transmitting internal write data INDin and a bus transmitting read data RD are provided independently of each other, and therefore it is not necessary to give consideration to conflict between the write data and the read data on these buses in view of column latency CL of DRAM core MCR. However, internal data transfer paths within DRAM core MCR are formed of common I/O data lines, and consideration must be given in the case where internal write data and internal read data are transmitted via a common I/O data bus in DRAM core MCR. However, an embedded DRAM is usually provided with internal data buses formed of a write data bus and a read data bus independent from each other, and it is not particularly necessary to give consideration to conflict between the write and read data on DRAM internal data buses.

Read data RD of 256 bits read from DRAM core MCR is applied to select circuit 4 of test interface circuit TIC via gate circuit 7. Select circuit 4 operates in accordance with read select signal RD_S applied at the timing adjusted by CA shifter 3. Select circuit 4 selects the data of 8 bits from read data TIFDout of 256 bits, and applies the same to first-in first-out circuit 10. This selection is made with the delay time of one cycle in test interface circuit TIC and column latency CL in DRAM core MCR taken into account. FIFO control circuit 15 counts the number of read commands READ, which are externally applied when output enable signal OE is at L-level, in accordance with the read instructing signal sent from latch and command decoder 1, and applies a write pointer to first-in first-out circuit 10 for storing data Dout of 8 bits applied from select circuit 4 in first-in first-out circuit 10.

In clock cycle #3, data Dout read from DRAM core MCR is temporarily stored in first-in first-out circuit 10. Therefore, even if I/O pin terminal group 9 is externally supplied with test input data Din together with the test control signal forming write command WRITE in this clock cycle #3, conflict does not occur between the data read from DRAM core MCR and the test input data.

In clock cycle #4, the successive test operations are completed, and then output enable signal OE is raised to H-level so that bidirectional I/O circuit 8 is set to the data output mode, and therefore the output buffer circuit 8a is set to the active state. When one clock cycle elapses after output enable signal OE rises from L-level to H-level, FIFO control circuit 15 successively reads out the data stored in first-in first-out circuit 10, and applies them to output buffer circuit 8a. In this operation, the data is read from first-in first-out circuit 10 after elapsing of one clock cycle since output enable signal OE rises from L-level to H-level and the data output mode is set. This is because one clock cycle is required for switching between input and output modes in bidirectional I/O circuit 8.

FIFO control circuit 15 successively outputs the stored data while changing the read pointer of first-in first-out circuit 10 by the number equal to the number of read commands which are applied when output enable signal OE is at L-level. Accordingly, as shown in FIG. 2, the data read in accordance with the read commands, which are externally applied in synchronization with the falling of test clock signal TCLK in cycles #0 and #2, are successively output in each clock cycle after falling of test clock signal TCLK in clock cycle #5.

This first-in first-out circuit is utilized as a so-called buffer circuit for changing the latency in the data read operation of DRAM core MCR, data conflict does not occur, and the test operation can be accurately performed even if the read/write operations are successively performed via the data input terminals and the data output terminals of I/O common arrangement.

Figure 3:
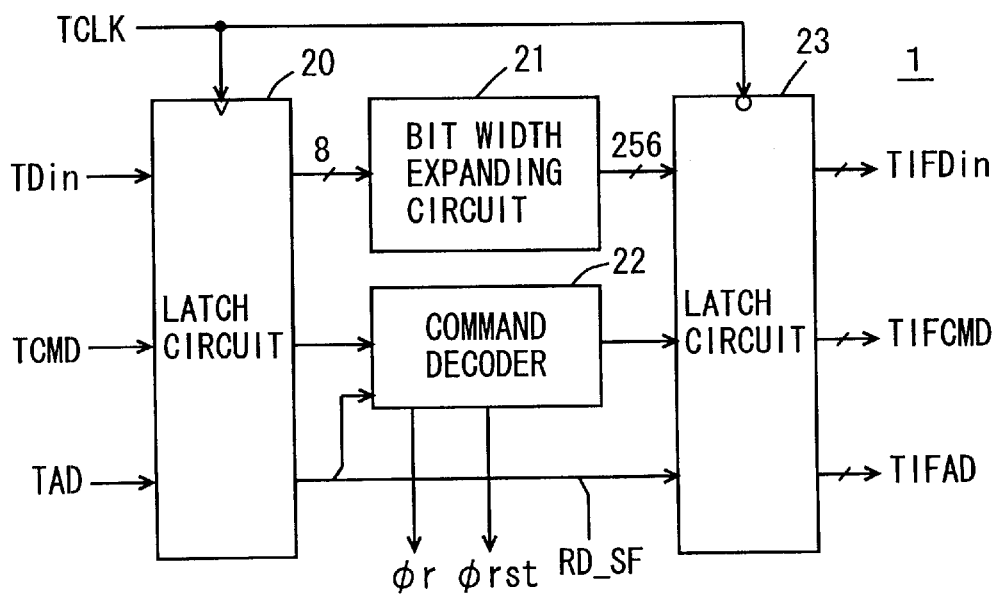
FIG. 3 schematically shows a structure of a latch/command decoder shown in FIG. 1.

FIG. 3 schematically shows a structure of latch and command decoder 1 shown in FIG. 1. In FIG. 3, latch and command decoder 1 includes: a latch circuit 20 which latches test input data TDin, test control signal TCMD and test address TAD in response to test clock signal TCLK; a bit width expanding circuit 21 which converts the test input data of 8 bits received from latch circuit 20 to the test input data of 256 bits; a command decoder 22 which decodes the test control signal sent from latch circuit 20; and a latch circuit 23 which latches, in response to test clock signal TCLK, the test input data of 256 bits sent from bit width expanding circuit 21, the test command sent from command decoder 22 and the test address sent from latch circuit 20, and issues a test input data TIFDin, a test command TIFCMD and a test address TIFAD to selector 5 shown in FIG. 1.

Latch circuit 20 takes in the signal/data which are applied when test clock signal TCLK is at L-level, and outputs and latches the taken signal when test clock signal TCLK attains H-level. Latch circuit 23 takes in the signal/data which are applied when test clock signal TCLK is at H-level, and outputs and latches the taken signal when test clock signal TCLK attains L-level. Even if bit width expanding circuit 21 and command decoder 22 process the signal/data asynchronously with test clock signal TCLK, due to latch circuits 20 and 23, test input data TDin, test control signal TCMD and test address TAD are output from latch circuit 23 as input data TIFDin, test command TIFCMD and test address TIFAD after elapsing of one clock cycle.

Command decoder 22 receives predetermined bits of test address and test control signal TCMD, and produces internal commands such as a mode register set command MRS, no-operation command NOP, active command ACT, precharge command PRE, read command READ and write command WRITE in accordance with a designated operation mode. Further, command decoder 22 produces a read instructing signal $\phi r$ when it receives read command READ, and produces a reset signal $\phi rst$ when it receives a test end command. Upper five bits of the column address in test address TAD output from latch circuit 20 are applied as read select signal RD_SF to CA shifter 3. The reason for using select signal RD_SF formed of five bits is that 32-to-1 selection must be performed for selecting the data of 8 bits from the data of 256 bits. By applying read select signal RD_SF of 5 bits to CA shifter 3, the circuit structure can be simplified as compared with the structure in which the read select signal of 32 bits is shifted. Accordingly, the 256-to-8 select circuit 4 has a function of decoding read select signal RD_SF.

Bit width expanding circuit 21 is formed of interconnection lines which are connected to expand the data of 8 bits to the data of 256 bits. In this data expanding operation, the 8-bit data may be duplicated to form 32 data, or 8-bit data may be produced from the bits of the same figure. In accordance with the manner of bit width expansion, the manner of selection in the select circuit 4 is determined.

Figure 4:
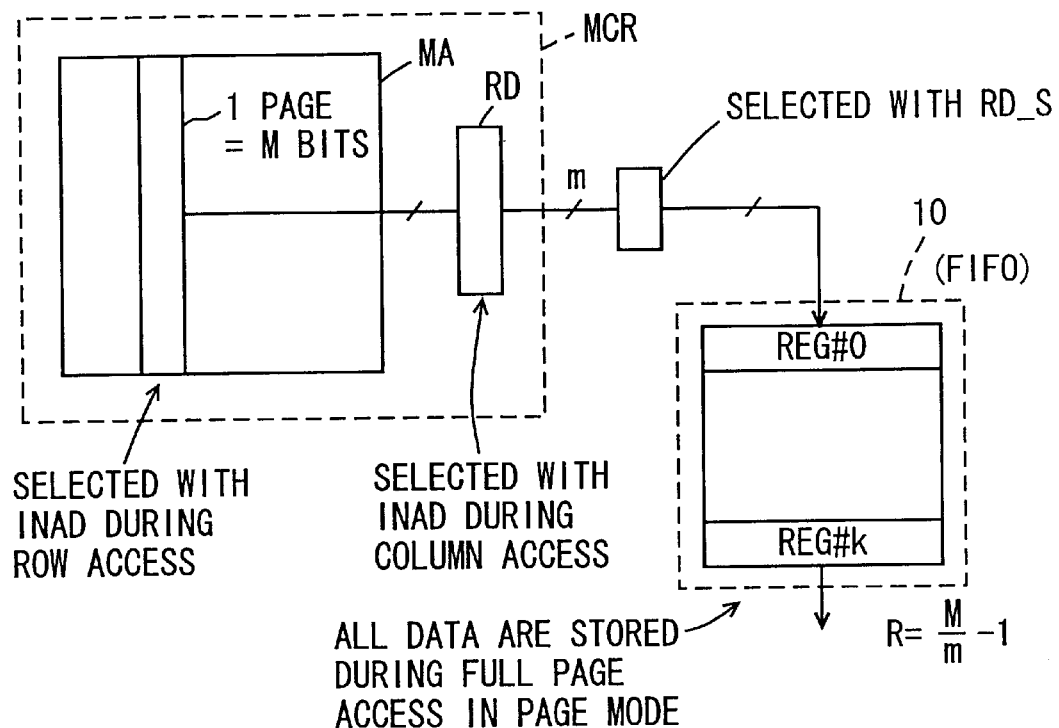
FIG. 4 schematically shows a structure of a first-in first-out circuit shown in FIG. 1.

FIG. 4 schematically shows a structure of first-in first-out (FIFO) circuit 10. Also, FIG. 4 schematically shows an array structure of DRAM core MCR.

In DRAM core MCR, a memory array MA includes memory cells arranged in rows and columns. In the row access operation performed upon application of active command ACT, one page is selected in accordance with internal address INAD which is applied at the same time as the active command ACT. The one page represents a memory cell row selected by internal address INAD. The one page has the memory cells of M bits.

From the memory cells of M bits in one page, data of m bits are read out upon the column access (read command or write command). In this embodiment, therefore, memory cells of 256 bits are selected from 2048 bits for writing or reading data to or from the selected memory cells, if M bits in one page are equal to 2048 bits. In the case of read data RD, select circuit 4 selects data of 8 bits from read data RD of m bits in accordance with read select signal RD_S. The data selected by the select circuit are successively stored in first-in first-out circuit (FIFO) 10.

First-in first-out circuit 10 includes register circuits REG#0–REG#k, where k satisfies a relationship of (k=(M/m)−1). When DRAM core MCR is to be accessed, the column access is successively performed in the page mode. In the page mode, the largest number of read data RD are read when a full-page access is performed. Thus, data of M/m in number can be read in the page mode. Therefore, in the case where read data RD is formed of 256 bits and one page has the size of 2K bits, eight register circuits REG#0–REG#7 (i.e., register circuits of eight stages) are arranged because 2K/256=8. The maximum number of data in the successive access operation can be all stored in first-in first-out circuit 10. When the full page is accessed, it is necessary to return temporarily memory array MA to the precharge state for page switching. During this precharge state, the column access cannot be executed, but data can be read from first-in first-out circuit 10. Therefore, first-in first-out circuit 10 is merely required to have at least a capacity capable of storing all the read data when the full page access is performed in the page mode.

Figure 5:
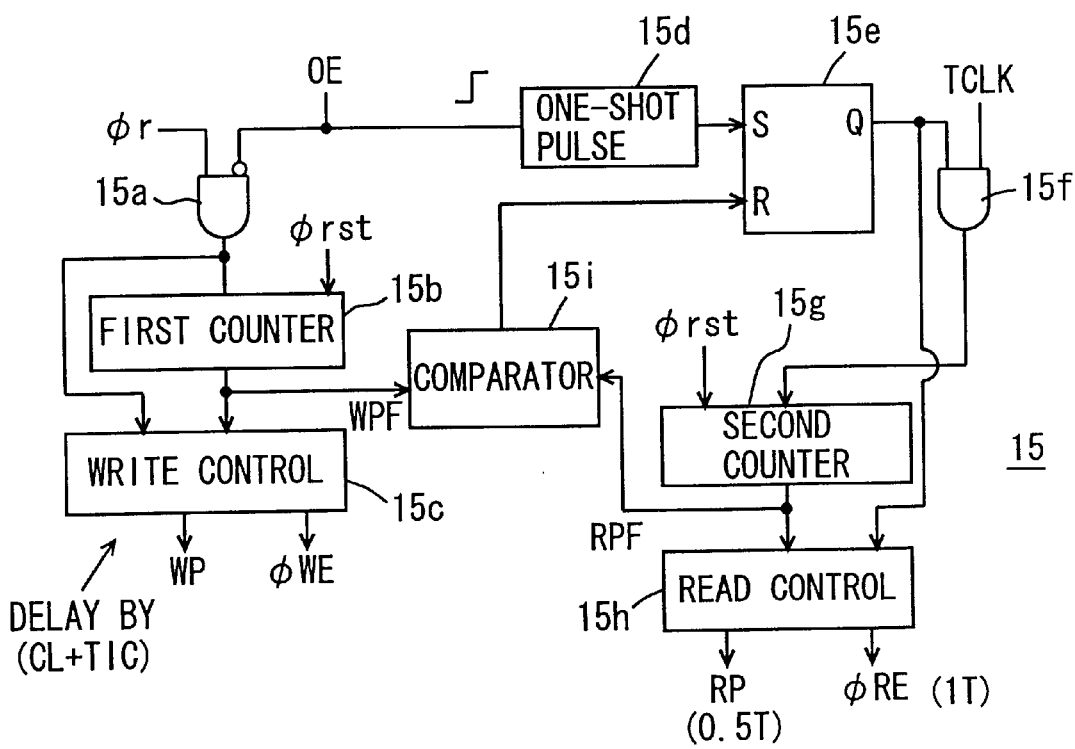
FIG. 5 schematically shows a structure of an FIFO control circuit shown in FIG. 1.

FIG. 5 schematically shows a structure of FIFO control circuit 15 shown in FIG. 1. FIFO control circuit 15 includes: a gate circuit 15a receiving read instructing signal $\phi r$ and output enable signal OE; a first counter 15b which counts the rising of the output signal of gate circuit 15a, and produces a write pointer WPF; and a write control circuit 15c which generates a write pointer WP and a write instructing signal $\phi WE$ for the first-in first-out circuit in accordance with the output signal of gate circuit 15a and write pointer WPF generated from first counter 15b. Write control circuit 15c performs the shift operation for the same period as the CA shifter, and controls the timing so that the data can be written into first-in first-out circuit 10 immediately upon arrival of the data read from DRAM core MCR. Therefore, write control circuit 15c delays the received signal by a period equal to a sum of column latency CL and delay of test interface circuit TIC (half clock cycle because of presence of the latch circuit).

FIFO control circuit 15 further includes: a one-shot pulse generating circuit 15d which generates a one-shot pulse having a predetermined pulse width in response to rising of output enable signal OE; a set/reset flip-flop 15e which is set in response to the output signal of one-shot pulse generating circuit 15d; an AND circuit 15f which receives the output signal generated from an output Q of set/reset flip-flop 15e and test clock signal TCLK; a second counter 15g which performs counting to produce a read pointer RPF in response to rising of the output signal of AND circuit 15f; and a read control circuit 15h which receives read pointer RPF outputted from second counter 15g and output Q of set/reset flip-flop 15e, to produce read pointer RP and read instructing signal $\phi RE$ for the first-in first-out circuit. Read control circuit 15h controls the first-in first-out circuit to read the data after elapsing of one clock cycle (i.e., the clock cycle period required for switching between input and output) from rising of output enable signal OE to H-level.

FIFO control circuit 15 further includes a comparator 15i which compares write pointer WPF generated from first counter 15b with read pointer RPF from second counter 15g, to reset set/reset flip-flop 15e upon detection of matching. First and second counters 15b and 15g set their counts to initial values (pointers designating register circuit REG#k) in accordance with reset signal φrst, respectively.

Figure 6:
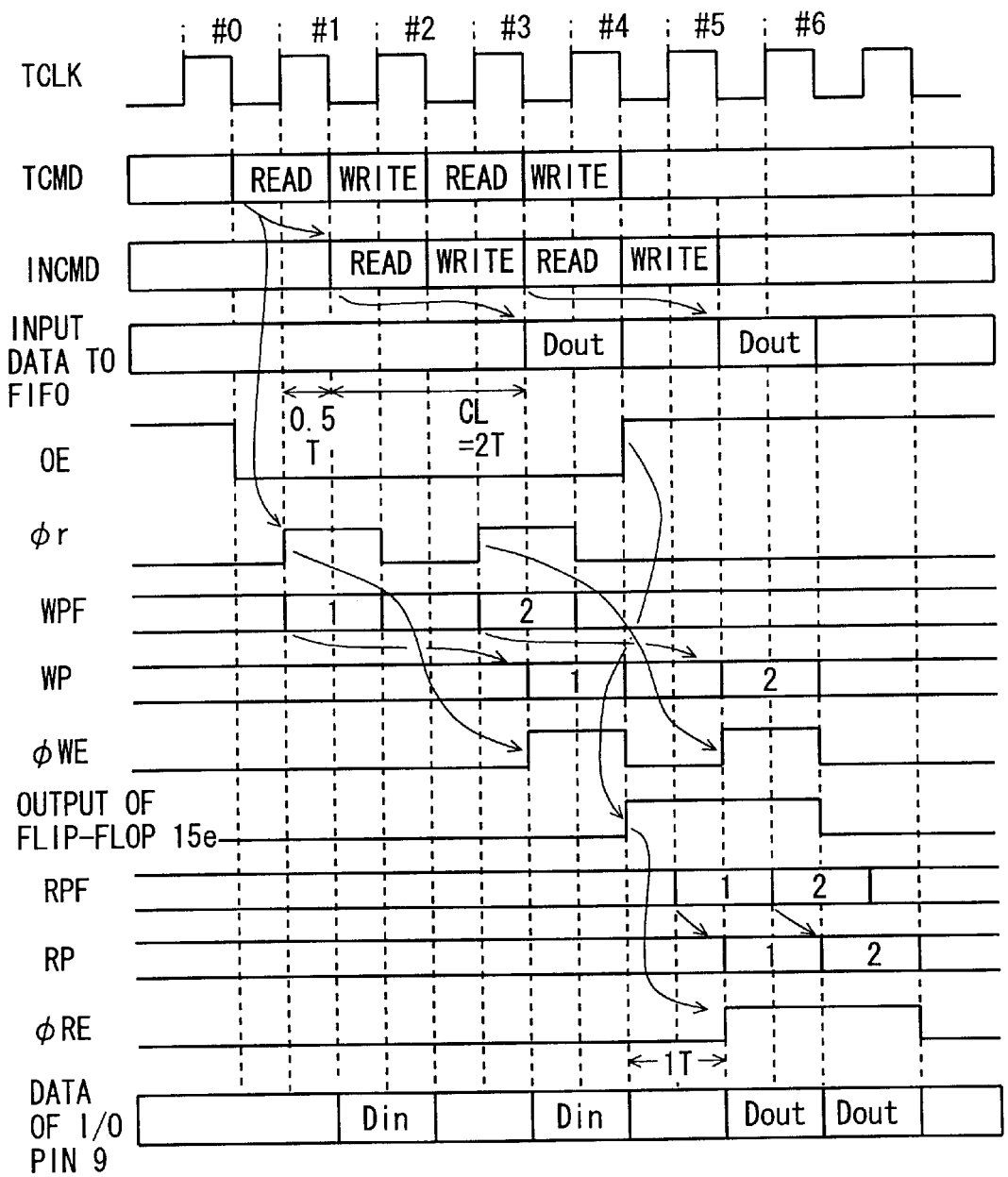
FIG. 6 is a timing chart representing an operation of the FIFO control circuit shown in FIG. 5.

Referring to FIG. 6, description will now be given on the operation of FIFO control circuit 15 shown in FIG. 5.

In synchronization with falling of test clock signal TCLK in clock cycle #0, test control signal TCMD is applied. In latch and command decoder 1, latch circuit 20 is arranged in the first stage as shown in FIG. 3, and the internal signal changes with a delay of half the clock cycle. In clock cycle #1, therefore, read instructing signal φr sent from command decoder 22 shown in FIG. 3 attains H-level in synchronization with rising of test clock signal TCLK, and signals FIFO control circuit 15 that the command instructing the data reading is applied. This read instructing signal φr is kept at H-level for one clock cycle period T. When read instructing signal φr attains H-level, output enable signal OE is at L-level, and the output signal of gate circuit 15a attains H-level. Thereby, first counter 15b performs counting in synchronization with rising of the output signal of gate circuit 15a, and increments its count by one. Write control circuit 15c provides the delay, by column latency CL and the signal transfer delay in test interface circuit TIC (i.e., half the clock cycle due to latch circuit 23), or 2.5 clock cycles and if column latency CL is 2, to read instructing signal φr by 2.5 clock cycles to issue write instructing signal φWE to the first-in first-out circuit.

If the control signal decoded into the read command is externally applied again in clock cycle #2, read instructing signal φr attains H-level again in synchronization with rising of test clock signal TCLK in clock cycle #3, and first counter 15b performs the counting to increment its count by one in response to the rising of read instructing signal φr. The count value from first counter 15b, i.e., write pointer WPF is delayed by 2.5 clock cycles by write control circuit 15c, and is applied as write pointer WP to first-in first-out circuit.

The first-in first-out circuit is supplied with data Dout read from DRAM core MCR in clock cycle #3 in accordance with the read command. In this operation, write instructing signal φWE is active at H-level, and the first-in first-out circuit performs the data writing in accordance with the current write pointer WP.

The data read in clock cycle #5 is written into the corresponding register circuit of the first-in first-out circuit in accordance with the activated write instructing signal φWE and current write pointer WP of 2.

When the successive read/write operation test is completed, and output enable signal OE rises from L-level to H-level, one-shot pulse generating circuit 15d generates the pulse of one shot, and set/reset flip-flop 15e is set to generate the output signal at H-level. Responsively, the output signal from AND circuit 15f changes in accordance with test clock signal TCLK, and second counter 15g performs the counting in synchronization with the rising of test clock signal TCLK. Therefore, flip-flop 15e is set in response to the falling of test clock signal TCLK in clock cycle #4, and AND circuit 15f passes test clock signal TCLK therethrough so that second counter 15g performs the count operation in synchronization with rising of test clock signal TCLK in clock cycles #5 and #6, and updates it count (read pointer) RPF.

Read control circuit 15h delays the output count value of second counter 15g by half the clock cycle (0.5T) to produce read pointer PR. Read pointer RP changes in synchronization with falling of test clock signal TCLK after the cycle in which output enable signal OE attains H-level. Read control circuit 15h delays the output signal generated at output Q of flip-flop 15e by one clock cycle period (1T), and the read instructing signal φRE from read control circuit 15h rises to H-level in synchronization with the falling of test clock signal TCLK in and after clock cycle #5. Accordingly, after one clock cycle period (1T) elapses since output enable signal OE rises to H-level and the output buffer of the bidirectional I/O circuit starts to operate stably, reading of data from the first-in first-out circuit is performed in accordance with read instructing signal φRE and read pointer RP, and data Dout is applied to I/O pin terminal group 9 via the bidirectional I/O circuit.

Thereby, the data can be read from the first-in first-out circuit at an accurate timing determined considering the delay of read data in DRAM core MCR, i.e., column latency CL and the signal transfer delay in test interface circuit TIC.

When read pointer RPF from second counter 15g becomes equal in value to write pointer WPF (=2) from first counter 15b, the output signal of comparator 15i is activated, and set/reset flip-flop 15e is reset. Therefore, when the count of second counter 15g, i.e., read pointer RPF becomes equal in value to write pointer WPF from first counter 15b in clock cycle #6, flip-flop 15e is reset in synchronization with falling of test clock signal TCLK in clock cycle #6, and the output signal thereof falls to L-level. Thereby, read instructing signal φRE from read control circuit 15h is reset after one clock cycle elapses. Accordingly, even if the read command is applied when output enable signal OE is at L-level, successive read/write operations can be accurately performed without conflict on data on I/O terminal group 9.

The structure for resetting flip-flop 15e in synchronization with falling of test clock signal TCLK can be achieved by configuring comparator 15i to generate its output signal when test clock signal TCLK is at L-level. For example, a latch circuit which operates in synchronization with test clock signal TCLK may be arranged in the output stage of comparator 15i, or a gate circuit receiving an inverted signal of test clock signal TCLK and a signal indicative of the result of comparison between pointers WPF and RPF may be arranged in the output stage of comparator 15i.

Read instructing signal or from command decoder 22 is maintained in the active state for one clock cycle period T. However, read instructing signal φr may be in the form of one-shot pulse having a predetermined time width.

Write control circuit 15c and read control circuit 15h are achieved by a known latch circuit which transfers a signal in accordance with test clock signal TCLK. For example, a delay of half the clock cycle can be achieved by using a latch circuit 20 shown in FIG. 3.

In the case where a latch circuit is provided on the output of the first-in first-out circuit so that the data read from the first-in first-out circuit is applied to the bidirectional I/O circuit with a delay of half the clock cycle, read pointer RPF from second counter 15g may be applied to the first-in first-out circuit. In this case, read instructing signal φRE is formed by a delay circuit which delays the output signal of flip-flop 15e by half the clock cycle. First and second counters 15b and 15g may be configured to perform counting in response to falling of the clock signal. The count value before the counting may be used as a pointer.

Figure 7:
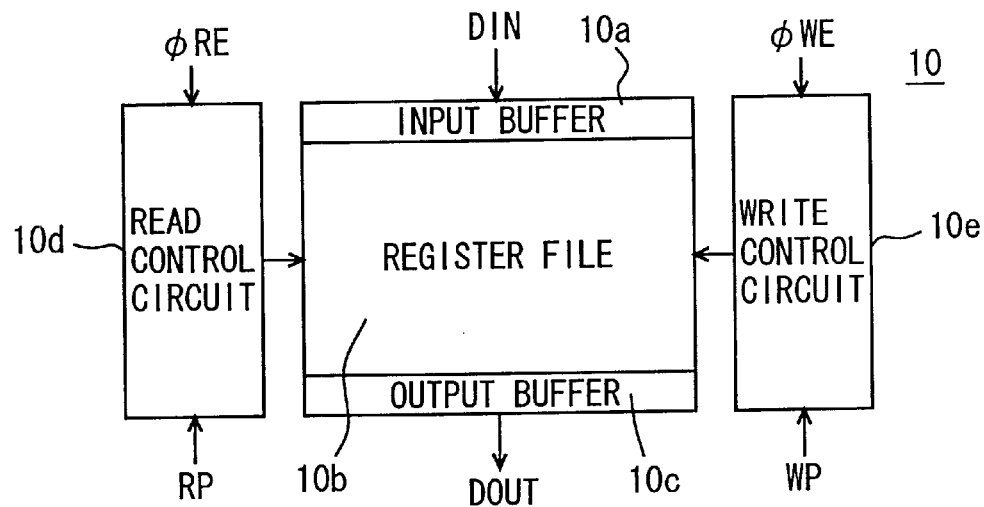
FIG. 7 schematically shows a structure of the first-in first-out circuit shown in FIG. 1.

FIG. 7 schematically shows a structure of first-in first-out circuit 10 shown in FIG. 1. In FIG. 7, first-in first-out circuit 10 includes an input buffer 10a receiving data DIN of 8 bits from gate circuit 7 shown in FIG. 1, a register file 10b having (k+1) register circuits, an output buffer 10c for buffering data read from a selected register circuit in register file 10b to produce output data DOUT, a read control circuit 10d for controlling reading out of data from the register circuit indicated by read pointer RP of register file 10b in accordance with read instructing signal φRE and read pointer RP, and a write control circuit 10e for controlling writing of 8-bit data from input buffer 10a into the register circuit indicated by write pointer WP of register file 10b in accordance with write instructing signal φWE and write pointer WP.

Read control circuit 10d and write control circuit 10e have internal structures appropriately determined in accordance with the structure of register file 10b. In the case where register file 10b is formed of, e.g., an SRAM (static RAM) having word lines and bit lines, each of write and read control circuits 10e and 10d includes an address decode circuit and a word line select circuit. Selection of the bit line pair is not performed, because bit line pairs of 8 bits are merely arranged.

Figure 8:
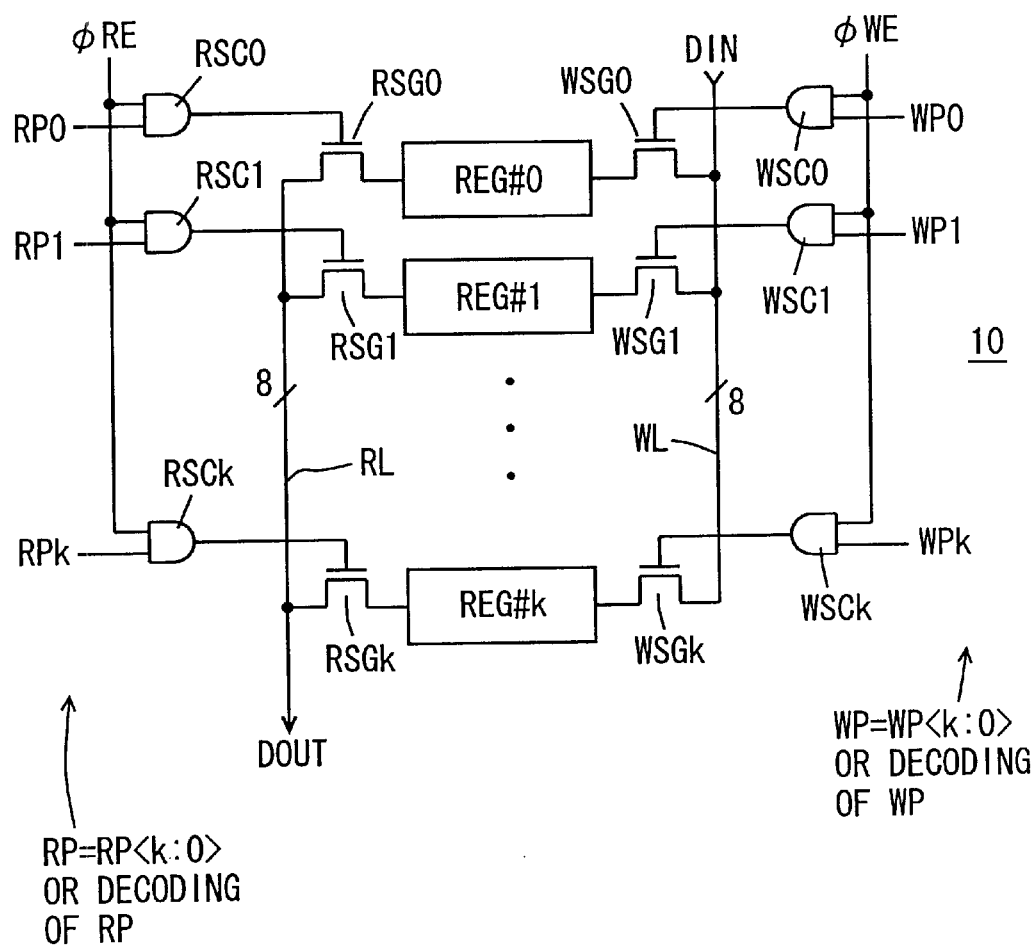
FIG. 8 shows a modification of the first-in first-out circuit shown in FIG. 1.

FIG. 8 shows a modification of first-in first-out circuit 10. In FIG. 8, write select gates WSG0–WSGk and read select gates RSG0–RSGk are provided for register circuits REG#0–REG#k, respectively. Register circuits REG#0–REG#k are coupled to a write data line WL via write select gates WSG0–WSGk, respectively and are coupled to a read data line RL via read select gates RSG0–RSGk, respectively. Each of write and read data lines WL and RL is signal lines of 8 bits.

Read select control gates RSCi (i=0–k) each receiving read instructing signal φRE and a read register select signal RPi (i=0–k) are provided corresponding to read select gates RSG0–RSGk, respectively. Write select control gates WSCi (i=0–k) each receiving write instructing signal φWE and a write register select signal WPi are provided corresponding to write select gates WSGi, respectively. Read register select signals RP0–RPk may be formed of respective bits of read pointer RPF or RP generated from second counter 15g or read control circuit 15h shown in FIG. 5, or may be produced by decoding read pointer RPF or RP by a decode circuit (not shown). Likewise, write register select signals WP0–WPk may be the respective bits of the write pointer WPF or WP of first counter 15b or write control circuit 15c shown in FIG. 5, or may be produced by decoding write pointer WPF or WP by a decode circuit (not shown). In the case where the output count bits of the first and second counters 15b and 15g shown in FIG. 5 are used as read register select signals PR0–PRk and write register select signals WP0–WPk, respectively, the first and second counters 15b and 15g are formed of shift registers, respectively, and the bit position in the active state is shifted in accordance with each count value. In this case, the shift registers are each configured into a ring-like form.

In the structure of the first-in first-out circuit shown in FIG. 8, register circuits REG#0–REG#k are merely selected by write select gates WSG0–WSGk or read select gates RSG0–RSGk for connection to write data line WL or read data line RL, respectively. Therefore, the circuit structure can be simple.

According to the first embodiment, as described above, when output enable signal OE is at L-level indicative of the data input mode, the read commands applied during this input mode are counted. The first-in first-out circuit performs input and output of the data in accordance with the count value, and the latency of the data read from the DRAM core can be changed. Accordingly, even if common test data I/O pin terminals are utilized, conflict does not occur between the test input data and the test output data, and the successive operation test for read/write can be performed.
[Second Embodiment]

Figure 9:
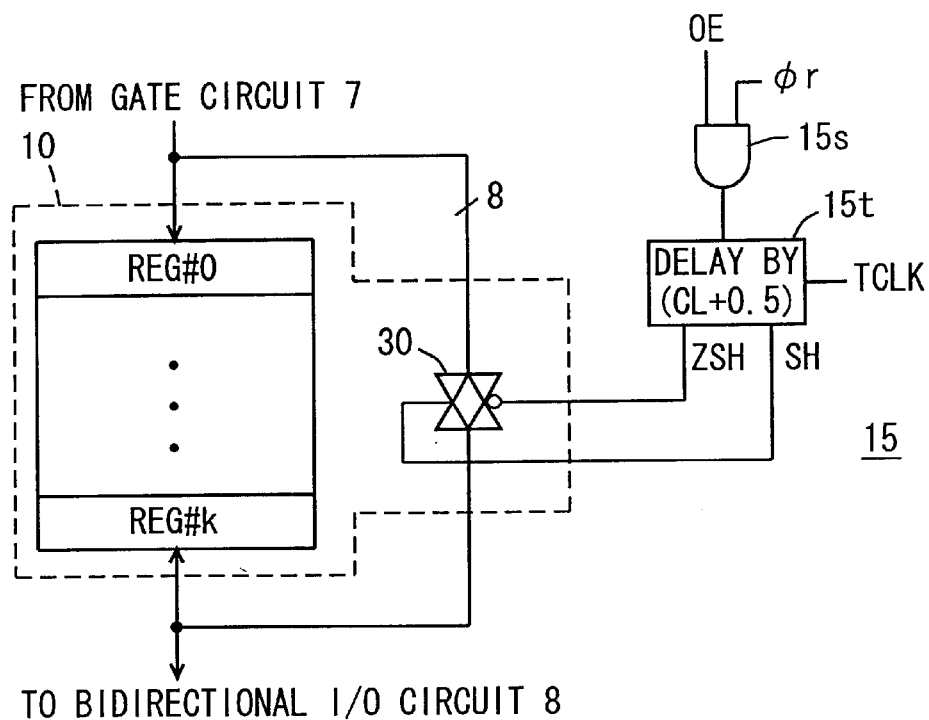
FIG. 9 schematically shows a structure of a test interface circuit according to a second embodiment of the invention.

FIG. 9 schematically shows a structure of a test interface circuit according to a second embodiment of the invention. In FIG. 9, first-in first-out circuit 10 is provided with a switch circuit 30 for bypassing register circuits REG#0–REG#k when made conductive. For instructing on/off of switch circuit 30, FIFO control circuit 15 includes an AND circuit 15s which receives output enable signal OE and read instructing signal φr, and a delay circuit 15t which delays an output signal of AND circuit 15s by a sum (CL+0.5) of column latency CL and half the clock cycle. This (CL+0.5) delay circuit 15t transfers the output signal of AND circuit 15s in accordance with test clock signal TCLK, and delays it for a period equal to a sum of column latency CL of test clock signal TCLK and 0.5 clock cycle. (CL+0.5) delay circuit 15t produces complementary output signals for controlling on/off of switch circuit 30.

Figure 10:
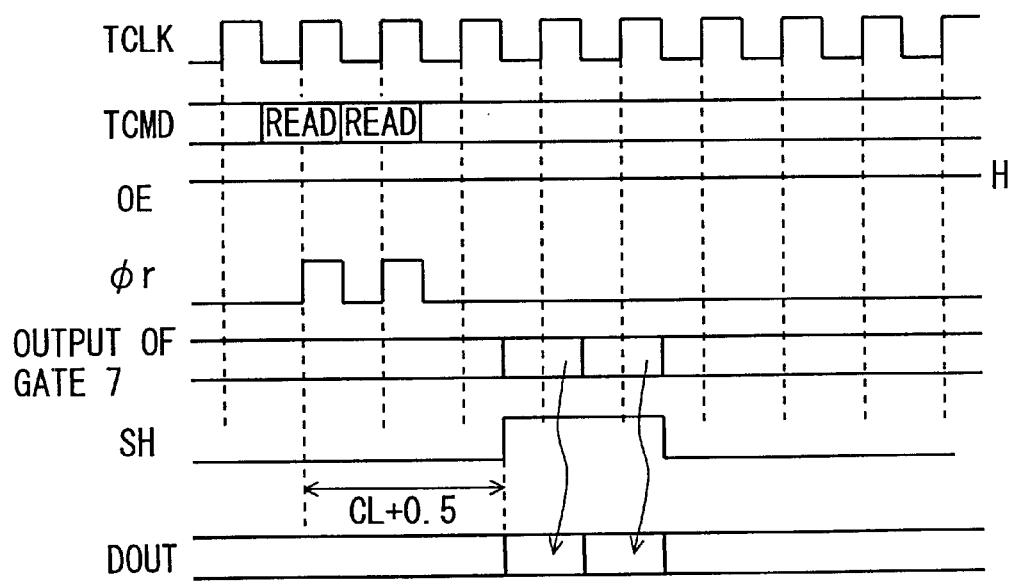
FIG. 10 is a timing chart representing operations of the test interface circuit shown in FIG. 9.

FIG. 10 is a timing chart representing an operation of the test interface circuit shown in FIG. 9. In the state where output enable signal OE is kept at H-level, control signals decoded into read commands READ are externally and successively applied. When read command READ is applied, read instructing signal φr from command decoder 22 shown in FIG. 3 is driven to the active state at H-level for a predetermined time H. In this case, read instructing signal φr is generated in the form of a one-shot pulse. This is for performing successive read operations.

When read instructing signal φr is activated, the output signal of AND circuit 15s attains the active state at H-level, and this active state is transmitted in accordance with test clock signal TCLK with a delay of a sum of column latency CL and 0.5 clock cycle. Therefore, a bypass control signal SH generated from (CL+0.5) delay circuit 15t attains H-level after elapsing of 2.5 clock cycles in accordance with read instructing signal φr which is activated in response to rising of test clock signal TCLK. Accordingly, the read data applied from gate circuit 7 bypasses register circuits REG#0–REG#k, and is applied to bidirectional I/O circuit 8 through switch circuit 30. Thereby, the successive read mode can be achieved.

In the above embodiment, consideration is given only to the successive read and write operations. However, the write and read operations can likewise be controlled by write and read control circuits 15c and 15h, and data reading from the first-in first-out circuit can be performed at an accurate timing.

According to the second embodiment of the invention, the register circuits in the first-in first-out circuit are bypassed when the read command is applied while output enable signal OE is at H-level, and therefore the successive read operation test can be performed reliably. Thereby, provision of the first-in first-out circuit does not restrict test items.
[Third Embodiment]

Figure 11A:
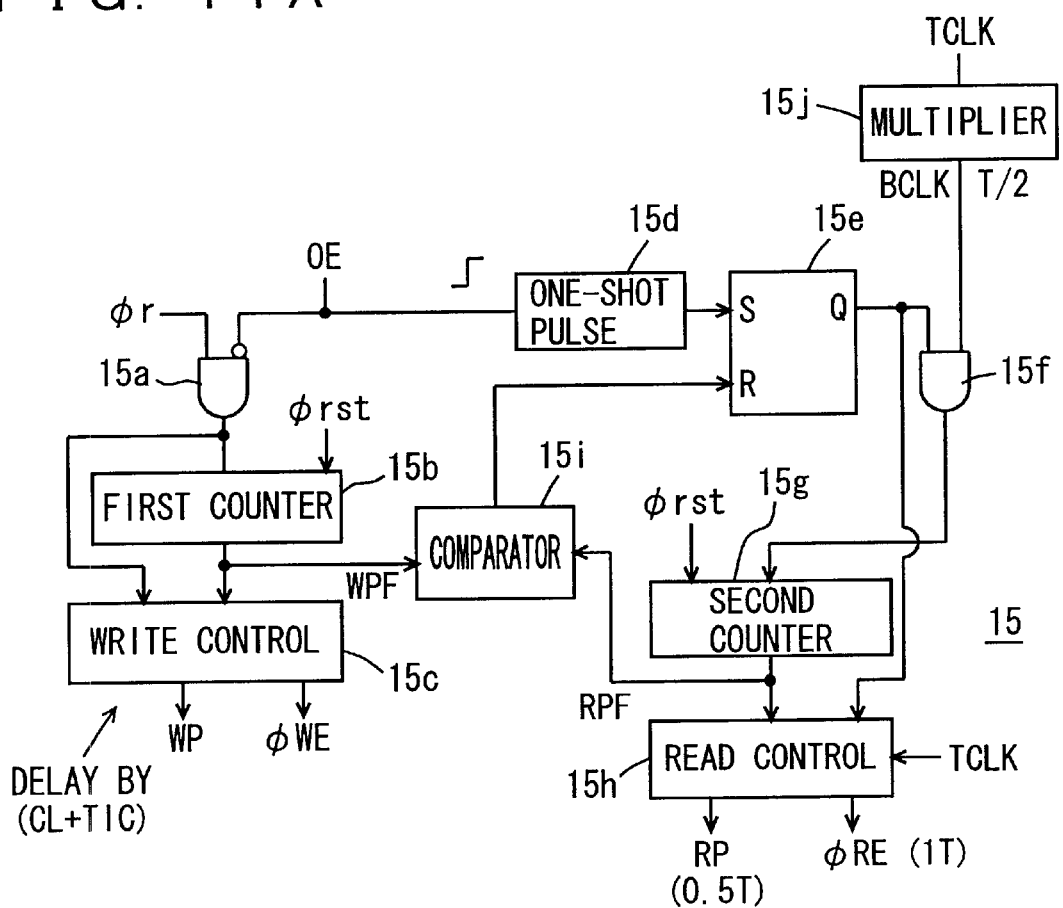
FIG. 11A schematically shows a structure of an FIFO control circuit according to a third embodiment of the invention.
Figure 11B:
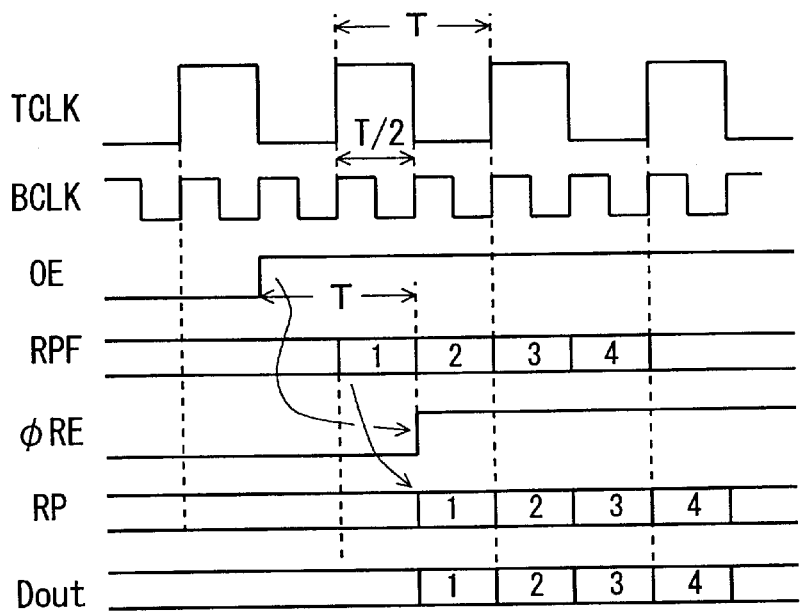
FIG. 11B is a timing chart representing operations of the FIFO control circuit shown in FIG. 11A.

FIG. 11A schematically shows a structure of a test interface circuit according to a third embodiment of the invention. FIG. 11A shows a structure of FIFO control circuit 15. FIFO control circuit 15 shown in FIG. 11A includes, in addition to the structure as that shown in FIG. 5, a frequency multiplier 15j which doubles the frequency of test clock signal TCLK. A frequency-multiplied signal BCLK from multiplier 15j is applied to AND circuit 15f receiving the output signal of set/reset flip-flop 15e. Read control circuit 15h is supplied with test clock signal TCLK. Second counter 15g executes the count operation in response to rising of the output signal of AND circuit 15f. Operation of the FIFO control circuit shown in FIG. 11A will now be described with reference to a timing chart of FIG. 11B.

When output enable signal OE rises to H-level, set/reset flip-flop 15e is set, and responsively read control circuit 15h drives read instructing signal φRE to the active state at H-level after elapsing of one clock cycle (T) of test clock signal TCLK. Second counter 15g executes the count operation in accordance with an output signal of AND circuit 15f. In this case, racing may occur between the rising of frequency-multiplied clock signal BCLK and rising of output enable signal OE, and counting at the rising edge of output enable signal OE may not be performed. Second counter 15g performs the count operation in response to the rising of frequency-multiplied clock signal BCLK from AND circuit 15f in the next clock cycle, and the count value is successively updated in synchronization with the rising of frequency-multiplied clock signal BCLK.

Output count value RPF of second counter 15g is transmitted via read control circuit 15h after elapsing of half the clock cycle (T/2) of test clock signal TCLK. In the first-in first-out circuit, therefore, read pointer RP is applied in synchronization with frequency-multiplied clock signal BCLK while read instructing signal φRE is active. Thereby, stored data are successively read out, and are applied as data Dout to the bidirectional I/O circuit.

Writing of data into the first-in first-out circuit is performed under the control of first counter 15b and write control circuit 15c, and therefore writing of data into the first-in first-out circuit is performed in synchronization with test clock signal TCLK at the speed of data reading from DRAM core MCR. By utilizing frequency-multiplied clock signal BLCK, the stored data is read from test interface circuit TIC at double the speed of test clock signal TCLK. Therefore, the time required for data reading in the test operation can be reduced, and the test cycle can be shortened.

[Fourth Embodiment]

Figure 12:
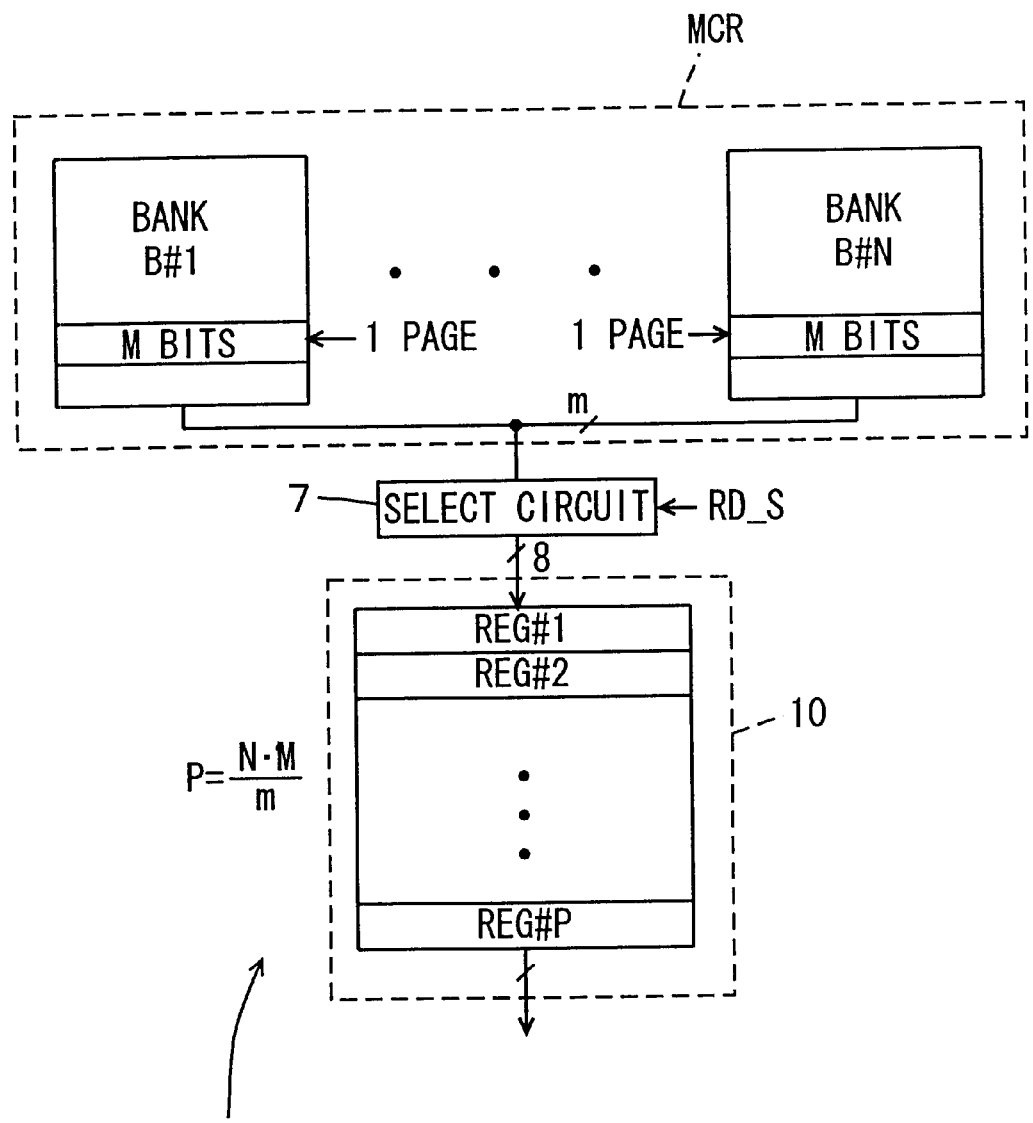
FIG. 12 schematically shows a structure of a first-in first-out circuit according to a fourth embodiment of the invention.
Figure 13:
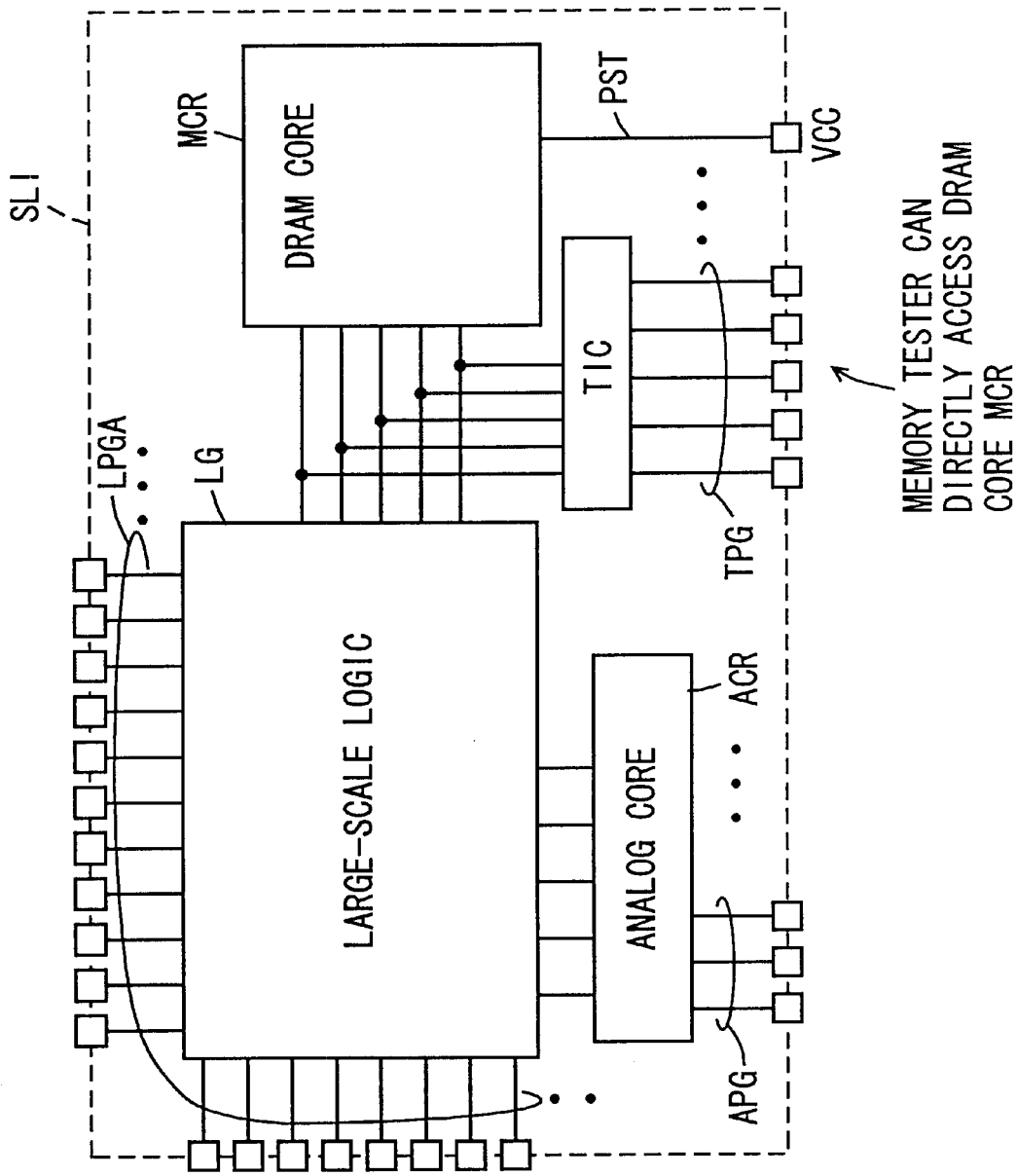
FIG. 13 schematically shows a structure of a conventional system LSI.

FIG. 12 shows a structure of a main portion of an embedded DRAM according to a fourth embodiment of the invention. In FIG. 12, DRAM core MCR includes N banks B#1–B#N. Banks B#1–B#N have the same structures, in which one page has a size of M bits. Each of banks B#1–B#N can be driven to the active state to hold the page in the selected state independently of the others. The data of m bits read from banks B#1–B#N is converted to the data of 8 bits via select circuit 7, and is applied to first-in first-out circuit 10. First-in first-out circuit 10 includes register circuits REG#1–REG#P, where P=N·M/m.

In the case where data is read out from banks B#1–B#N of DRAM core MCR in the page mode, up to N·M/m data can be successively read out. The data of m bits (256 bits) read out from DRAM core MCR is converted by select circuit 7 to the data of 8 bits. Therefore, it is necessary to store up to N·M/m data in the first-in first-out circuit. Assuming that the banks are N in number, first-in first-out circuit 10 can store the data, which is successively read in the case where all the banks are accessed in accordance with the page mode, owing to provision of register circuits REG#1–REG#P.

Register circuits REG#1–REG#P successively store the data, which are stored in banks B#1–B#N, in the order of reading from the DRAM core. It is not necessary to monitor which register circuit stores the data read from which bank. Since the test program has already determined the relationship between data and banks, the relationship between data and a bank can be obtained with a tester. In first-in first-out circuit 10, therefore, register circuits REG#1–REG#P are provided commonly to banks B#1–B#N. It is not necessary to distribute the data in accordance with the respective banks for storing them in the first-in first-out circuit, and therefore the circuit structure can be simple.

[Other Examples of Application]

One page in the embedded DRAM may have a size other than 2048 bits. The input/output data of the DRAM core may have a bit width m of, e.g., 128 bits or 512 bits other than the foregoing value.

Column latency CL may take a value other than 2. If delay of the input data in the bidirectional I/O circuit cannot be neglected, the data write timing of the first-in first-out circuit is adjusted considering this delay.

The memory is not restricted to the DRAM, and may be another kind of memory such as a burst SRAM (Static Random Access Memory) or a flash memory, which operates in synchronization with the clock signal. The invention can be applied to any memory, provided that the memory is integrated with a logic on the same semiconductor substrate.

As described above, the invention can provide the test interface circuit, which allows a sufficient test on a mixed (embedded) memory without constraints on the test patterns due to the test data input/output switching timing, even if the I/O pins for the test data used in the mixed memory are formed of an I/O common structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A test interface circuit for externally testing a logic-merged memory comprising:

a first-in first-out circuit for successively storing data read from said memory, and successively reading out stored data in a same order as a data storing order;

a test writing circuit receiving externally applied data, for producing internal data to be written into said memory and transmitting the internal data to said memory; and a control circuit for controlling both data writing and reading of said first-in first-out circuit in response to an operation mode instruction signal instructing one of input and output of data.

2. The test interface circuit according to claim 1, wherein said memory has a plurality of memory cells arranged in rows and columns, the memory cells in one page having a size of M bits are simultaneously selected by a row selecting operation performed one time, and input/output data of said memory has a bit width of m with m being an integer; and said first-in first-out circuit includes register circuits arranged in M/m stages.

3. The test interface circuit according to claim 1, wherein said memory includes N banks to be driven to an active state independently of each other, each of said banks has a plurality of memory cells arranged in rows and columns, the memory cells in one page having a size of M bits are simultaneously selected by a row selecting operation performed one time, and data of a bit width of m is output with m being an integer; and said first-in first-out circuit includes register circuits arranged in N·M/m stages.

4. The test interface circuit according to claim 1, wherein said control circuit includes:

a first counter for counting a number of data reading from said memory in response to a data read instruction applied to said memory, and generating a write pointer indicating a position for writing data in said first-in first-out circuit in accordance with a count value when said operation mode instruction signal indicates a data input mode, and a second counter responsive to change of said operation mode instruction signal from data input mode instruction to data output mode instruction for generating a read pointer indicating a position of data to be read from said first-in first-out circuit according to a count value of said second counter, said read pointer and said write pointer initially indicating a same position.

5. The test interface circuit according to claim 1, wherein the data from said first-in first-out circuit is transmitted to a pad via a bidirectional input/output circuit coupled to said pad, and a data transfer direction of said bidirectional input/output circuit is determined in response to said operation mode instruction signal.

6. The test interface circuit according to claim 4, wherein said memory performs input and output of data in synchronization with a test clock signal, and
said second counter performs a count operation in response to rising and falling of said test clock signal, to generate said read pointer.

7. A semiconductor integrated circuit device comprising:
a logic for performing an arithmetic operation;
a memory for storing at least data used for said arithmetic operation of said logic; and
a test interface circuit for allowing a test through external and direct accessing to said memory,
said test interface circuit including
a first-in first-out circuit for successively storing data read from said memory, and successively reading out stored data in a same order as a data storing order, and
a control circuit for controlling data writing and reading of said first-in first-out circuit in response to an operation mode instruction signal instructing one of input and output of data.

8. The semiconductor integrated circuit device according to claim 7, wherein
said memory has a plurality of memory cells arranged in rows and columns, the memory cells in one page having a size of M bits are simultaneously selected by a row selecting operation performed one time, and input/output data of said memory has a bit width of m with m being an integer; and
said first-in first-out circuit includes register circuits arranged in M/m stages.

9. The semiconductor integrated circuit device according to claim 7, wherein
said memory includes N banks to be driven to an active state independently of each other, each of the banks has a plurality of memory cells arranged in rows and columns, the memory cells in one page having a size of M bits are simultaneously selected by a row access performed one time, and data of a bit width of m is output externally; and
said first-in first-out circuit includes register circuits arranged in N·M/m stages.

10. The semiconductor integrated circuit device according to claim 7, wherein
said control circuit includes:
a first counter for counting a number of reading from said memory in response to a data read instruction applied to said memory, and generating a write pointer indicating a position for writing data in said first-in first-out circuit in accordance with a count value thereof when said operation mode instruction signal indicates a data input mode, and
a second counter responsive to change of said operation mode instruction signal from data input mode instruction to data output mode instruction, for generating a read pointer indicating a position of data to be read from said first-in first-out circuit according to a count value of said second counter, said read pointer and said write pointer initially indicating a same position.

11. The semiconductor integrated circuit device according to claim 7, further comprising:
a bidirectional input/output circuit coupled between said first-in first-out circuit and a pad for outputting data read from said first-in first-out circuit to said pad, a data transfer path of said bidirectional input/output circuit being determined in response to said operation mode instruction signal.

12. The semiconductor integrated circuit device according to claim 10, wherein
said memory performs input and output of data in synchronization with a test clock signal, and
said second counter performs the count operation in response to rising and falling of said test clock signal, to generate said read pointer.

13. The semiconductor integrated circuit device according to claim 7, further comprising:
a selector responsive to a test mode instruction signal for connecting said test interface circuit to said memory, and isolating said logic from said memory.

14. The semiconductor integrated circuit device according to claim 10, wherein said second counter stops the count operation when the count value of said first counter matches the count value of said second counter.

15. The semiconductor integrated circuit device according to claim 12, further comprising a frequency multiplier for generating a frequency-multiplied clock signal having a frequency double a frequency of the test clock signal.

16. The semiconductor integrated circuit device according to claim 7, wherein said first-in first-out circuit includes registers arranged in a plurality of stages and a switch circuit for bypassing the registers.

17. The test interface circuit according to claim 1, wherein said test writing circuit includes:
a bit width extending circuit receiving said externally applied data for expanding a bit width of said externally applied data to generate said internal data for transmission to said memory.

18. The test interface circuit according to claim 1, wherein said test writing circuit includes:
first latch circuit for latching said externally applied data in response to a test clock signal,
bit width expanding circuit for expanding data latched by said first latch circuit to generate said internal data, and
a second latch circuit for latching said internal data received from said bit width expanding circuit for transmission to said memory in response to said test clock signal.

19. The test interface circuit according to claim 5, wherein said test writing circuit is coupled to said bidirectional input/output circuit and said first-in first-out circuit, and said bidirectional input/out circuit transfers data with one of said test writing circuit and said first-in first-out circuit in accordance with said operation mode instructing signal.

* * * * *